US012791601B2

(12) United States Patent
Lewis et al.

(10) Patent No.: US 12,791,601 B2
(45) Date of Patent: Nov. 10, 2026

(54) APPROACHES AND PROBES FOR EXCITATION, DETECTION, AND SENSING OF DEVICES UNDER TEST

(71) Applicant: InZiv Ltd., Jerusalem (IL)

(72) Inventors: David Judah Lewis, Jerusalem (IL); Emanuel Elyasaf, Jerusalem (IL)

(73) Assignee: InZiv Ltd., Jerusalem (IL)

( * ) Notice: Subject to any disclaimer, the term of this patent is extended or adjusted under 35 U.S.C. 154(b) by 125 days.

(21) Appl. No.: 18/989,923

(22) Filed: Dec. 20, 2024

(65) Prior Publication Data

US 2025/0123320 A1 Apr. 17, 2025

Related U.S. Application Data

(63) Continuation of application No. PCT/IB2023/056866, filed on Jun. 30, 2023.

(Continued)

(51) Int. Cl.
*G01R 31/26* (2020.01)
*G01R 1/067* (2006.01)

(Continued)

(52) U.S. Cl.
CPC ..... *G01R 31/2635* (2013.01); *G01R 1/06755* (2013.01); *G01R 1/06794* (2013.01); *G01R 1/07342* (2013.01); *G09G 3/006* (2013.01)

(58) Field of Classification Search
USPC ..................................................... 324/750.16
See application file for complete search history.

(56) References Cited

U.S. PATENT DOCUMENTS

| | | | |
|---|---|---|---|
| 5,027,075 | A | 6/1991 | Harding, Jr. |
| 7,043,848 | B2 | 5/2006 | Hollman et al. |

(Continued)

FOREIGN PATENT DOCUMENTS

| | | | |
|---|---|---|---|
| KR | 102286322 B1 | 8/2021 | |
| KR | 102386932 B1 | 4/2022 | |
| WO | 2012026927 A1 | 3/2012 | |

OTHER PUBLICATIONS

Liu, Guoqiang et al., "Evolution of Dip-Pen Nanolithography (DPN): From Molecular Patterning to Materials Discovery," Chemical Reviews 2020 120 (13), Apr. 2020, pp. A-AM.

(Continued)

*Primary Examiner* — Farhana A Hoque

(74) *Attorney, Agent, or Firm* — Sterne, Kessler, Goldstein & Fox P.L.L.C.

(57) ABSTRACT

Approaches and probes for excitation, detection, and sensing of samples. An example method includes positioning probes of a test tool relative to contact points that are associated with samples of a sample array such that the probes come into electrical contact with the sample array at the contact points, driving parallel electrical excitation of the samples, where electrical contact between the probes and the contact points is maintained continuously while performing the driving, and the parallel excitation of the samples produces values for testing the samples, and repeating the foregoing one or more times for other contact points. Another example method submerges a probe in a liquid conductive material to provide a conductive liquid at the end of the probe thereof and that can be positioned and/or moved continuously relative to the contact points of a sample to facilitate delivery of an electrical signal to drive excitation of the sample.

19 Claims, 19 Drawing Sheets

Related U.S. Application Data

(60) Provisional application No. 63/367,563, filed on Jul. 1, 2022.

(51) Int. Cl.
*G01R 1/073* (2006.01)
*G09G 3/00* (2006.01)

(56) References Cited

U.S. PATENT DOCUMENTS

| | | | | |
|---|---|---|---|---|
| 7,400,159 | B2 | 7/2008 | Wang et al. | |
| 10,753,959 | B1 | 8/2020 | Saketi et al. | |
| 2012/0098559 | A1 | 4/2012 | Bolt et al. | |
| 2013/0000117 | A1 | 1/2013 | Baskaran et al. | |
| 2020/0191830 | A1 * | 6/2020 | Watanabe | G01R 1/07364 |
| 2020/0233033 | A1 | 7/2020 | Kim | |
| 2020/0379029 | A1 | 12/2020 | Hasegawa et al. | |

OTHER PUBLICATIONS

Zhang, Xinpeng et al., "Photopolymerized Features via Beam Pen Lithography as a Novel Tool for the Generation of Large Area Protein Micropatterns," Nano Micro Small, Feb. 2022, pp. 1-8.

Cao, Wenhan et al., "Massively Parallel Cantilever-Free Atomic Force Microscopy," Nature Communications, Jan. 2021, pp. 1-7.

Kim, Gwangmook et al., "Binary-State Scanning Probe Microscopy for Parallel Imaging," Nature Communications, Mar. 2022, pp. 1-9.

Kim, K.-H et al., "Massively Parallel Multi-Tip Nanoscale Writer With Fluidic Capabilities—Fountain Pen Nanolithography (FPN)," Proceedings of the 4th International Symposium on MEMS and Nanotechnology, Jun. 2003 (no further date information available), pp. 235-238.

Dickey, Michael D., "Liquid Metals At Room Temperature," Physics Today, Apr. 2021, pp. 31-36 (+ cover pages).

Vettiger, P. et al., "The 'Millipede'—Nanotechnology Entering Data Storage," IEEE Transactions on Nanotechnology, vol. 1, No. 1, Mar. 2002, pp. 39-55.

Livshits, Gideon I. et al., "Sacrificial Gold Coating Enhances Transport Of Liquid Metal In Pressurized Fountain Pen Lithography," Scientific Reports, Feb. 2021, pp. 1-9.

Hussain, Navid et al., "High-Resolution Capillary Printing of Eutectic Gallium Alloys for Printed Electronics," Advanced Material Technologies, Jul. 2021, pp. 1-11.

Ye, Zhou et al., "Phase Change of Gallium Enables Highly Reversible and Switchable Adhesion," Advanced Materials, May 2016, pp. 5088-5092.

Hantschel, Thomas et al., "Stressed Metal Probes For Atomic Force Microscopy," Applied Physics Letters, vol. 81, No. 16, Oct. 2002, pp. 3070-3072.

Chow, Eugene M., "Microsprings For Integrated Test And Packaging," The Proceedings of the International Wafer-Level Packaging Conference, Oct. 2010, pp. 1-10.

"Probe Card—Nano Ultra-Fine Element Electrical Inspection Technology," Nano X, downloaded from the internet Dec. 19, 2024, pp. 1-7.

Chow, Eugene M., "Pressure Contact Micro-Springs in Small Pitch Flip-Chip Packages," IEEE Transactions on Components and Packaging Technologies, vol. 29, No. 4, Dec. 2006, pp. 796-803.

Maniscalco, B. et al., "Thin Film Thickness Measurements Using Scanning White Light Interferometry," Elsevier, Thin Solid Films, vol. 550, Jan. 2014, pp. 10-16.

Probe Station—Ultra-Fine Element Electrical Inspection Technology, Nano X, downloaded from the internet Dec. 19, 2024, pp. 1-5.

"Notification of Transmittal of the International Search Report and the Written Opinion of the International Searching Authority, or the Declaration," International Application No. PCT/IB 23/56866, Nov. 17, 2023, pp. 1-16.

Lewis, Aaron et al., "Development of a 500 Å spatial resolution light microscope: I. light is efficiently transmitted through λ/16 diameter apertures," Elsevier, Ultramicroscopy, vol. 13, Issue 3, 1984 (no further date information available), pp. 227-231.

Extended European Search Report, dated Jan. 23, 2026, For European Patent Application No. 23830649.2, 14 pages.

Supplementary Partial European Search Report, dated Sep. 26, 2025, for European Patent Application No. 23830649.2, 14 pages.

* cited by examiner

APPROACHES AND PROBES FOR EXCITATION, DETECTION, AND SENSING OF DEVICES UNDER TEST

CROSS-REFERENCE TO RELATED APPLICATIONS

This application claims priority to International Patent Application No. PCT/IB2023/056866, filed on Jun. 20, 2023 and U.S. Provisional Patent Application No. 63/367,563, filed Jul. 1, 2022, both of which are hereby incorporated herein by reference in their entirety.

BACKGROUND

Devices such as electronic, optoelectronic, electromechanical and other types of devices can be inspected and tested. An example is electrical excitation which imposes a voltage or current to a contact that is in electrical communication with the device. Typically, in this example, the device and the contact are part of the same circuit, and the imposition of the current/voltage is to drive excitation of the device to produce a variety of signals, such as emission and reflection values. These may then be monitored or sensed optically and/or electrically and recorded for analysis. A device subjected to such testing may be referred to as a device under test (DUT).

SUMMARY

Often there are many devices on a wafer or other surface for testing and it is desired and advantageous to devise methods that can be applied to test devices in parallel via parallel electrical, electrochemical, optical, or other such excitation with parallel detection or sensing or both. The DUT (which may also be referred to herein as 'sample') can therefore dually refer to each individual device being tested as well as the collection of individual devices, whether tested simultaneously or in succession.

Shortcomings of the prior art are overcome and additional advantages are provided through the provision of methods/processes. An example method is for testing a sample array that includes individual samples. The method uses a test tool that includes comprising a plurality of electrically-conductive test probes, and the method includes positioning the plurality of test probes relative to a first plurality of contact points of the sample array, the first plurality of contact points being associated with a first plurality of individual samples of the sample array, such that the plurality of test probes come into electrical contact with the sample array at the first plurality of contact points, driving, by way of one or more electrical signals delivered via the plurality of test probes to the first plurality of contact points, parallel electrical excitation of the first plurality of individual samples, where electrical contact between the plurality of test probes and the first plurality of contact points is maintained continuously while performing the driving the parallel excitation of the first plurality of individual samples, and where the parallel excitation of the first plurality of individual samples produces first values for testing the first plurality of individual samples, moving the plurality of test probes relative to the sample array by moving at least one of the plurality of test probes and the sample array, such that, based on the moving, the plurality of test probes are positioned relative to a next plurality of contact points such that the plurality of test probes come into electrical contact with the next plurality of contact points, the next plurality of contact points associated with a next plurality of individual samples of the sample array, and driving, by way of one or more electrical signals delivered via the plurality of test probes to the next plurality of contact points, parallel electrical excitation of the next plurality of individual samples, where electrical contact between the plurality of test probes and the next plurality of contact points is maintained continuously while performing the driving the parallel excitation of the next plurality of individual samples, and where the parallel excitation of the first plurality of individual samples produces second values for testing the next plurality of individual samples.

In embodiments, the individual samples are micro light-emitting diode (microLED) devices.

In some embodiments, driving the parallel electrical excitation of the first plurality of individual samples is performed absent use of active feedback to continuously maintain the electrical contact between the plurality of test probes and the first plurality of first contact points while performing the driving the parallel electrical excitation of the first plurality of individual samples.

In embodiments, the process further includes observing, based on interaction of the plurality of test probes with the first plurality of contact points, luminescence from the first plurality of individual samples and confirming, based on the luminescence, that the electrical contact between the plurality of test probes and the first plurality of contact points has been made, and the driving is performed responsive to the confirming.

In embodiments, the process further includes observing, as part of the positioning the plurality of test probes relative to the first plurality of contact points, reflective signals from the plurality of test probes and confirming, based on the observed reflective signals, that the electrical contact between the plurality of test probes and the first plurality of contact points has been made, wherein the driving the parallel electrical excitation of the first plurality of individual samples is performed responsive to the confirming.

In embodiments, at least a portion of each test probe of the plurality of test probes is made of translucent material.

In embodiments, the plurality of test probes comprises an array of test probes with equidistant spacing between test probes of the array of test probes.

Additionally, a method is provided for testing a sample, and the method includes submerging at least a portion of an electrically-conductive test probe of a test device in a liquid conductive material, withdrawing the submerged at least a portion of the test probe from the liquid conductive material, where a portion of the liquid conductive material remains on an end of the test probe and in electrical contact with an electrically-conductive portion of the test probe, positioning the test probe relative to a contact point of the sample such that the portion of liquid conductive material on the end of the test probe makes physical contact with the contact point of the sample, and driving, by way of an electrical signal delivered via the test probe to the contact point through the portion of liquid conductive material on the end of the test probe, an excitation of the sample.

In embodiments, the positioning positions the end of the test probe relative to the contact point such that the end of the test probe and the contact point are physically spaced-apart, where the portion of liquid conductive material occupies at least a space between the end of the test probe and the contact point, and electrically bridges the electrically-conductive portion of the test probe and the contact point.

In embodiments, the sample is a micro light-emitting diode (microLED) device.

In embodiments, the liquid conductive material is metallic. In some such embodiments, the liquid conductive material comprises gallium.

In embodiments, the process further includes monitoring an electrical signal from the test probe and determining, based on the monitored electrical signal, whether electrical contact with the contact point has been made.

In embodiments, the test probe is one test probe of a plurality of test probes of the test device, where the sample is one of an array of samples, and where the submerging, withdrawing, positioning, and driving is performed with each test probe of the plurality of test probes to electrically couple each test probe with a respective contact point of a respective sample of the array of samples and drive an excitation of the respective sample.

Additionally, an apparatus for testing a device under test (DUT). The DUT includes a plurality of individual devices, and the apparatus includes an array of probes, an alignment system for aligning the DUT and array of probes relative to each other, and a detection system configured to detect signals from the plurality of individual devices, where the apparatus is configured to test sets of individual devices, of the plurality of devices, by scanning electrical contacts of the sets of individual devices while driving electrical excitation of the electrical contacts.

In embodiments, the scanning includes moving the array of probes relative to the DUT by moving at least one of the array of probes and the DUT, where the moving brings the array of probes into contact with a respective set of electrical contacts for each set of individual devices of the sets of individual devices.

In embodiments, the moving repeatedly brings the array of probes into contact with the respective set of electrical contacts for each set of individual devices, in which the moving brings the array of probes (i) into contact with one set of electrical contacts for one set of individual devices of the sets of individual devices, then (ii) out of contact with the one set of electrical contacts for the one set of individual devices, then (iii) into contact with another set of electrical contacts for another set of individual devices of the set of individual devices.

In embodiments, the scanning includes scanning the DUT under the array of probes.

In embodiments, the alignment system is further for leveling the DUT relative to the array of probes.

In embodiments, the signals include optical, electrical, or electrochemical signals from the individual devices, and the tool is further configured to detect, using the detection system, the optical, electrical, or electrochemical signals. In examples, the tool can such signals with excitation or without excitation (able to detect self-emission).

Additional aspects of the present disclosure are directed to systems and computer program products configured to perform the methods described above and herein. The present summary is not intended to illustrate each aspect of, every implementation of, and/or every embodiment of the present disclosure. Additional features and advantages are realized through the concepts described herein.

BRIEF DESCRIPTION OF THE DRAWINGS

Aspects described herein are particularly pointed out and distinctly claimed as examples in the claims at the conclusion of the specification. The foregoing and other objects, features, and advantages of the disclosure are apparent from the following detailed description taken in conjunction with the accompanying drawings in which:

DETAILED DESCRIPTION

Figure 1A:
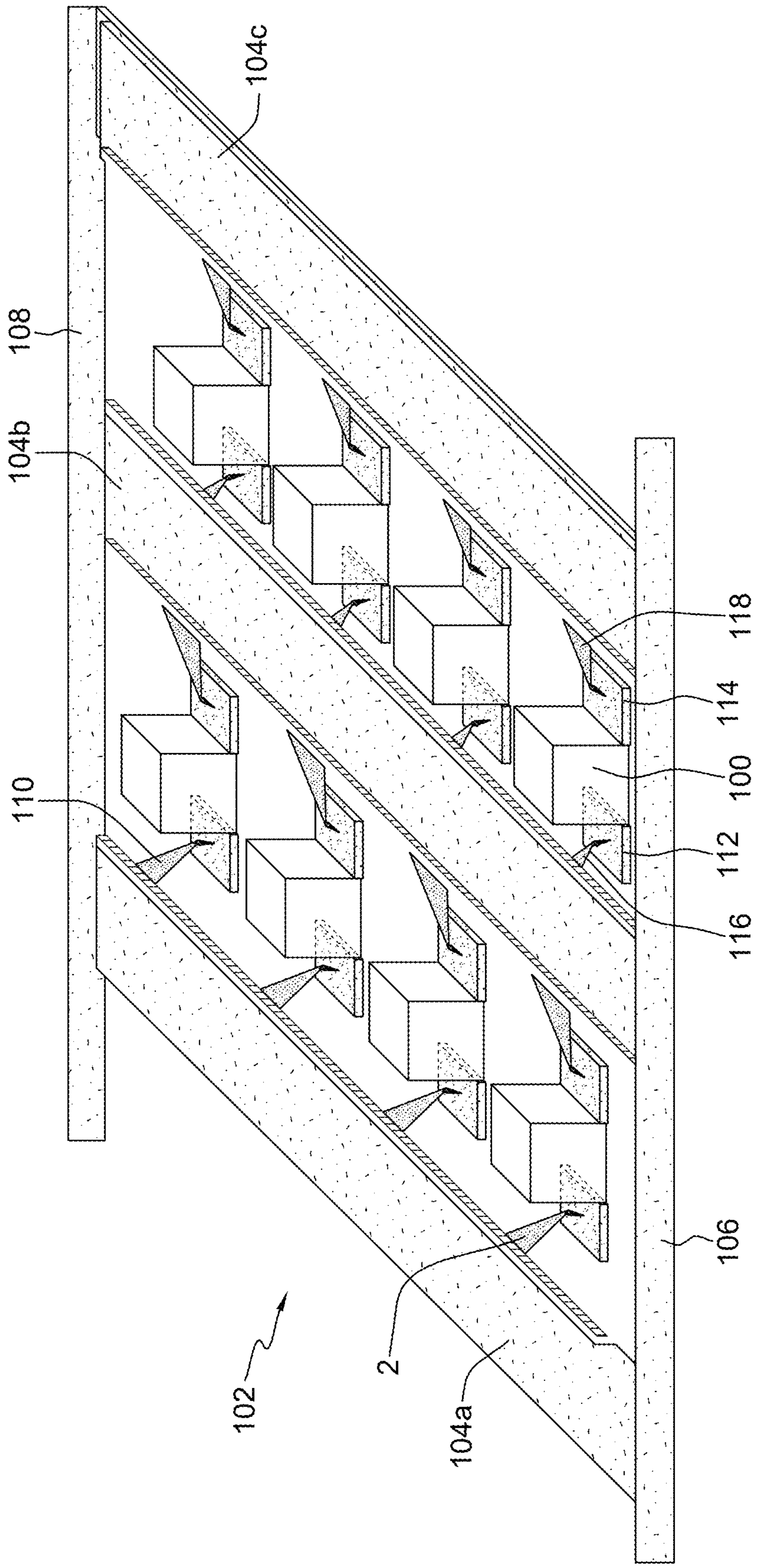
FIGS. 1A-1E depict an example environment and components thereof to incorporate and use aspects described herein.

Described herein are facilities, e.g. tools and methods, for excitation and testing of devices, for instance those provided on a surface/substrate. In some aspects, the induced excitation of the DUT can be imposed repeatedly with minimal or no degradation in terms of the efficacy of the tool or the DUT. Geometries that meet desired use cases of the tool can enable transparent optical or other forms of readout that result from this excitation to facilitate evaluation of DUT performance.

One of several examples of such testing is electro-optical electroluminescence for micro light-emitting diode (also referred to as "microLED" "micro-LED", "mLED", and "μLED") display inspection. Many examples described herein are presented with reference to testing of microLEDs. MicroLED testing can be particularly useful for microLED display inspection. MicroLED displays incorporate millions of microLEDs, and efficient testing thereof is a crucial step in achieving large-scale manufacture and marketability of microLED displays.

Aspects described herein enable parallel testing using arrays of probes. Parallel testing in accordance with aspects described herein can achieve excellent, consistent, and repeatable results. Examples involve electrical interactions in parallel to effectively excite arrays of devices for inspection. Though features described herein are presented with specific reference to microLEDs, those with ordinary skill in the art will appreciate that features described herein can be used in testing/inspection of a variety of devices and types of samples, including electro-mechanical, electro-optical and other types of devices/samples including electrochemical and chemical, and further that aspects can apply to both single element testing and multiple element testing, e.g. arrays of devices.

In some embodiments, a tool is provided that operates as a series of probes to impose voltage or current to contact points in order to excite a plurality of corresponding devices (e.g. electronic, optoelectronic, or electromechanical DUT, as examples), and then optically and/or electrically monitor the signals produced from the plurality of devices being excited. The probes make electrical contact at multiple sites in-parallel.

In contact-based testing, probes are placed in physical contact with the contact points and with some appreciable level of force applied. To ensure appropriate contact between the probe array and the corresponding contact points, and to avoid damaging the probes and/or DUT, the physical interaction between the probes and the contact points, including the force with which the probes touch the contact points, after initial contact may be monitored. Adjustments can then be made as appropriate to ensure that the probes remain in contact with the associated contact points with appropriate contact force applied. The actions and intervention undertaken based on the observed signals and other indications of this physical interaction monitored after the initial contact are a form of "feedback". More specifically, these activities undertaken after initial contact to maintain the contact is referred to as "active" feedback, and the monitoring/adjustment occurs as part of a feedback-based approach to positioning, and possibly leveling, the test tool relative to the DUT. Too much pressure can damage the probe and/or the DUT but, as described in accordance with aspects herein, various methods are available to avoid such damage.

Alternatively, the probes could be made with the appropriate flexibility, in essence 'soft-touch'/flexible, and these can be applied with or without requiring monitoring and adjustment as active feedback in order to adjust their flex or bending e.g., as an end of a paint brush would flex/bend. In cases where active feedback is implemented, an electronic or other signal could be altered based on the force being applied in order to identify proper adjustments needed to maintain a desired amount of force.

Methods and devices discussed herein enable repeated parallel, flexible, contact (electrical contact, in some embodiments) and interactions to excite, with functional efficacy, multiple devices under test, without damage to the probe or devices, and without requiring and/or undertaking any measure/monitor of active feedback (but permitting such active feedback if so desired). In some examples, this is provided via appropriate mechanical characteristics such that a plurality of probes can repeatedly make appropriate interaction with electrical contacts of device(s) without damaging the probe or device structure. In addition, use of a liquid metal for acting as a flexible interface between the device and the probe/probes could also be provided as described herein. Thus, in embodiments where once electrical contact has been established, device excitement can be observed optically (e.g. by the human eye or by a camera or other optical/imaging system as examples) and/or electrically, as examples, but active feedback, such as feedback that includes checking an electrical signal continuously to identify if electrical contact is broken or for leveling purposes, or checking that the forces applied remain appropriate, as examples, may be optional.

Probe configuration can vary depending on the particular DUT. When considering probe configurations that a plurality of probes (an array), a flexible probe array may be fabricated with an appropriate pitch and geometry to provide, if desired, an unobstructed view of the DUT at the highest powers of optical microscopy when exciting the DUT. Silicon-based and other microfabrication technologies such as 3D printing can provide what is needed in terms of fabricating the probe array with proper flexibility, mechanical characteristics, geometry, and electrical patterning for supplying the necessary electrical input and output as dictated by the particular parameters of the DUT to achieve desired excitation.

By way of specific example, a matrix or array of probes can be provided, for instance provided as part of a patterned board or card as an example, and can be configured so that the connections, such as electrical connections, that the probe array makes with the DUT may be detected, for instance electrically. This can be useful in leveling and aligning the probe array relative to the DUT. Leveling, whether based on electrical contact/interaction, mechanical leveling, or optical leveling, or otherwise, may be an important part of the test process. With electrical contact-based leveling, it may be desired to detect whether and when interactions are made between the test probes and the electrical contacts of the DUT for driving the electrical excitation. The detection of such electrical connection between the tool and devices under test could be of considerable importance for leveling the tool (e.g., the probe array thereof) on the surface of the wafer or other substrate having the devices under test, and to ensure accurate test results are obtained. Other aspects of probe-surface interactions could also be used for leveling the probes that test the device. Capacitive signals, and even optical signals, could be implemented to align the probes to the surfaces. For instance, capacitive signals could excite devices under test, which provide an indication of contact that can be used for leveling purposes.

In addition to the probes themselves providing the signals for alignment, there are other methods of leveling and alignment conventionally requiring a high degree of precision, and relative alignment. These are often used in the semiconductor industry for precise interaction of the tool with the wafer on which the devices are patterned. In specific examples, the facilities for leveling and alignment could include the following subassemblies: wafer loader, wafer stage, wafer alignment system, a loader for the testing tool, tool stage and alignment system, an optical detection system. All of these subassemblies are readily available after years of development in the semiconductor industry and can be implemented with aspects discussed herein. They can in some examples be provided as part of an enclosure that maintains precise temperature to control expansion or contraction of the wafer due to temperature variations. The enclosure could optionally also contain other systems that support the process, such as air conditioning, power supplies, control boards, and various other electrical components and subcomponents, as examples, to implement aspects described herein.

Fabrication technology applied to aspects described herein, for instance the fabrication of probe arrays, could permit a variety of alterations, an example of such is an alteration to the pitch of the probes to appropriately align to an array of devices under test. The devices may be pitched at micrometric, submicrometric, or nanometric dimensions in examples.

In terms of electrical contact between a test tool of probe(s) and the DUT, aspects can account for and allow a variety of geometries. For instance, where each device in the array of devices to test is associated with two electrical contacts (for positive and negative polarity for example), a respective two electrical contacts for each individual device in the array could be at either side of the individual device (i.e., one positive (P) or lead contact proximate one side of the device and one negative (N) or ground contact proximate the other side of the device, for instance). Alternately, a single contact may be used as a first contact (such as a ground contact) for all the devices under test and, for each such device, a respective second contact point/pad (as a lead contact) may be used for each device and be placed proximate a side of that device. A specific example of this is a geometry in which a single contact provided at one side (e.g. bottom) of the wafer/substrate/plane on which the devices are provided is used as a first contact (e.g. ground) for each of the devices, and a respective second contact (lead contact) for each device is provided at another side (opposite side, top) of the wafter/substrate/plane. Other geometries are possible.

In cases of an optoelectronic device under test, for instance a microLED-based display, the microLEDs of the DUT emit light as a result of, for example, electroluminescence, and this emitted light is measured for each microLED-that is, a respective measurement of light emitted from each microLED may be obtained as an indication of the individual performance of each such microLED. Accurate measurement can be challenging if the probe array obstructs the optical device(s) that measure the emitted light. When probe contact points are on a same side of the test sample as the individual devices under test (the microLEDs), then the probe tips to make contact at the contact points may be constructed with the appropriate geometry so that the emitted light from the devices under test is either not obscured or is essentially unperturbed.

The optical observation of the emission signals or other responses by the DUT in response to excitement thereof can be made from above, from below, and/or from an opposite side of the excitation, as examples. In some embodiments, a flat transparent surface, such as one on which the probe array is placed or coupled, is used for mechanical support and strength or other purposes, and also allows emitted light to pass therethrough for detection. It can also allow for excitation using the tool that could be driven by illumination of the wafer or device structure through the transparent surface and then measurement of a photovoltage or photocurrent generated in response. This may be the approach taken in solar array testing, for instance, where a voltage is generated with light or other solar excitation.

Microfabrication of the probe array (geometry, pitch, etc.) can be adjusted to the properties of the devices (geometry, pitch, etc.) on the DUT regardless of the modes of device monitoring, be it electrical response, device photovoltage/photocurrent response, photoluminescence, capacitance response, or other forms of responses. As a result, one obtains an integrated structure for the DUT and the measurement tool (e.g. probe array).

FIGS. 1A-1E depict an example environment with components thereof to incorporate and use aspects described herein. Referring initially to FIG. 1A, the environment can be useful in electrically exciting devices for test/inspection. An example individual device under test (DUT) is referenced by 100 in FIG. 1A. It is noted that DUT can refer to the collection of such devices 100 or each individual device 100 itself.

Each DUT 100 may be an electronic, optoelectronic, or electromechanical (as examples) device under test, and each may be provided on a plane (not pictured), such as a wafer or other substrate, for instance as part of an integrated circuit.

Figure 1B:
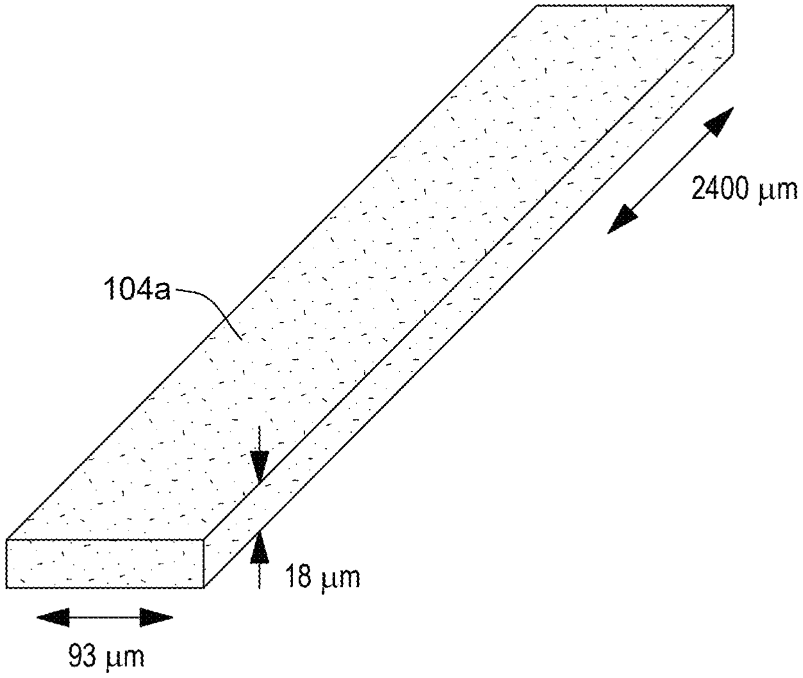

A test device (sometimes referred to as a 'tool' or 'test array') in this example includes a frame/structure 102 holding an array of probes 110. The frame 102 includes cross-supports 106, 108 between which probe array arms 104*a*, 104*b*, 104*c* run. Each such probe array arm 104*a*, 104*b*, 104*c* holds a respective plurality of probes 110 that are a sub-array. It is noted that the depicted frame 102 and associated probes could be just one segment of a larger frame structure and collection/array of probes of the tool. Segment 102 could therefore be replicated/repeated to form a more expansive test tool. The length of each cross rail segment 106, 108, and more generally the size of any of the components depicted and described, could be of any desired size and dimension. By way of example only, and not limitation, the length of each cross rail segment 106, 108 may be 15,400 μm. FIG. 1B depicts, by way of example only, sizing of probe array arm 104*a* that is 2400 μm long, 93 μm wide, and 18 μm tall (height). The frame 102, including its components, their sizing, spacing, etc., and the probe sizing, spacing, etc., can be tailored according to the layout and sizing of the devices being tested. The probe array can be constructed to facilitate lifting and placement thereof on devices with the proper pitch and geometry for making appropriate contact with the contact(s) of the DUT.

Figure 1C:
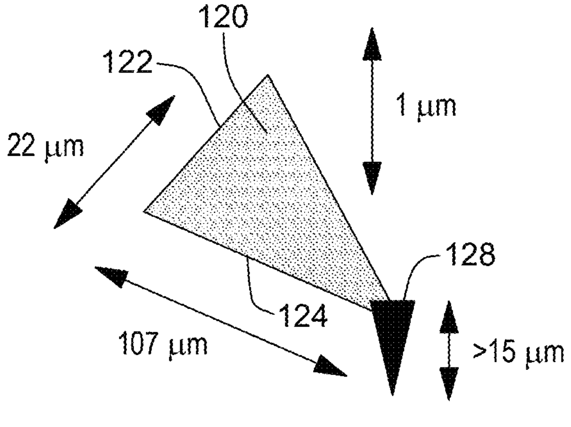

Each probe 110 of the array of probes may be a cantilever with a body portion and a tip portion. FIG. 1C depicts, by way of example only, sizing of an example probe 110. Body portion 120 has a base 122 of length 22 μm, side 124 of length 107 μm, and thickness of 1 μm. Tip portion 128 has a length of at least 15 μm in this example. The body and tip portions of the probe 110 may be, if desired, constructed of a common material as a unitary device.

In particular examples, the probe or portion(s) thereof can be configured and tailored with appropriate flexibility, which flexibility could be tailored to at least a selected amount. For instance, each probe can be configured with an appropriate force/spring constant, for instance having a force per meter of 1.0 Newtons per meter (N/m) or below for a specific material like silicon. In some embodiments, the constant is between 0.3 and 1.0 (inclusive). However, as is well-known the actual force depends on the material of the probe and can also be varied due to geometry thus permitting a variety of force constant to be adjusted for such testing. Additionally, as noted, if a liquid conductive material, such as gallium, is used as in embodiments described elsewhere herein, then this allows other, i.e., significantly larger force constants. Further, the desired force constant will vary (for instance by an order of magnitude higher or lower using the same fabrication technology) depending on various conditions such as angle or thickness of the cantilever that is desired for a particular geometry of DUT. In some embodiments the probes are to have a force constant selected to allow for appropriate flexibility such that when they touch and press against contact points they do not break and do not cause undue damage to the DUT. Additionally, the body portion 120 of a probe can extend (from a probe array arm 104*a*, 104*b*, 104*c*) at a first angle and the tip portion 128 forming an end of the probe (at the extreme end of the tip, distal relative to the probe arm) can extend at another angle relative to the first angle, i.e., at an angle relative to body portion 120. In this manner, the example probe 110 is provided with a bend or other change of direction in an area of the probe between its base and its tip, and at which the angle of extension changes.

Referring back to FIG. 1A, the frame 102 may be positioned relative to the DUT such that the probes of the probe array make contact with various points of contact (also referred to "contacts", "contact pads", "contact points", or just "pads") for exciting the DUT. In this regard, and in this particular example, each device 100 under test (microLED in this example) has associated with it a respective unique pair of contact pads-one as a lead and the other as a ground, or one as a positive (+) polarity contact and the other as a negative (−) polarity contact, as examples. Associated with the DUT labeled 100 in FIG. 1A are pads 112 and 114 with which probes labeled 116 and 118, respectively, make contact. It is understood that pads 112, 114 are in electrical contact with DUT 100 to enable excitation of DUT 100 by way of a voltage/current applied via the probe(s). As an example, one probe of the pair may be a voltage source and the other of the pair a voltage sink.

Figure 1D:
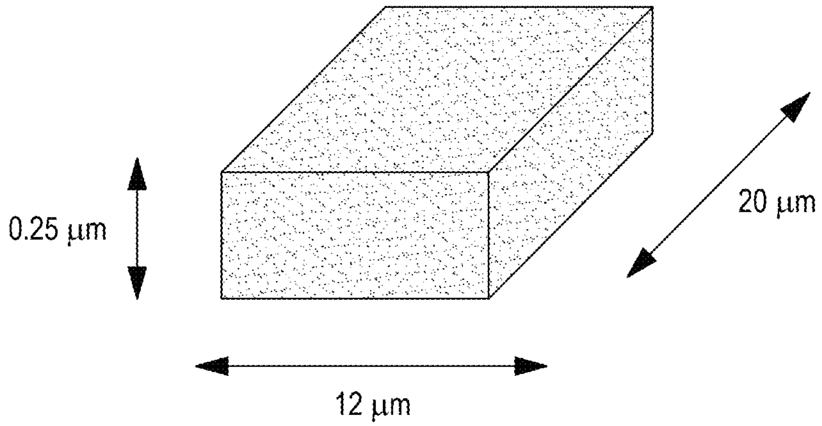
Figure 1E:
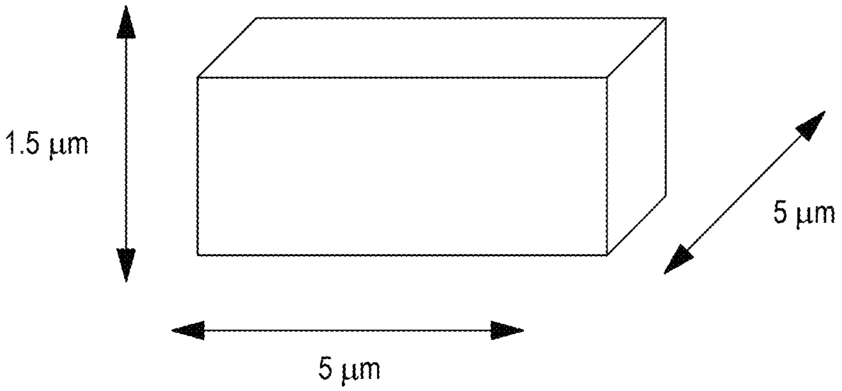

FIG. 1D depicts, by way of example only, sizing of an example contact pad (e.g. 112 of FIG. 1A), with dimensions of 20 μm×12 μm and a height of 0.25 μm. FIG. 1E depicts, by way of example only, sizing of an example microLED 100 (device under test), with dimensions of 5 μm×5 μm and height of 1.5 μm. These are example sizes and are not limiting on the geometries of the DUTs and associated components with which aspects discussed herein may be used.

Exciting the individual DUTs, microLEDs in this example, can proceed by imposing a voltage or inducing a current that causes the microLEDs to illuminate. Probe(s) come into electrical contact with the corresponding contact points/pads to make an electrical connection with the contact points. These contact points are either part of/incorporated into the device to be excited, such as the microLED itself, or are in electrical connection with the device, e.g. by way of an electrical via, lead, pin, route, trace, or the like. The voltage/current can be varied to monitor the response of the microLEDs to this varying, and across a range of the varying. In the case of microLEDs and other types of optoelectronic devices, the light emitted therefrom can be measured using optical sensor(s). Though not pictured in FIG. 1A, a transparent panel of glass or other material could be placed as a support for the probe array or could otherwise be disposed between the devices under test and the optical sensor(s), while allowing the light from the DUTs to shine through (e.g., upward) to be measured. Typically, though not always, all devices being tested, or discrete subsets of such devices, are part of a same underlying device, for instance a display panel in the case of microLEDs, and the electrical contacts used in testing may be patterned and formed in the process of forming the underlying device. Alternatively, the electrical contacts used in testing may be patterned and formed separate from the forming of the underlying device.

In the example of FIG. 1A, the cantilever design of the probes of the probe array provides ample exposure of the light emitted from the microLEDs to the area above the DUT. Optical sensors (not pictured) may therefore be arranged above the DUT and probe array portion of the test tool such that the probes do not interfere with optical exposure and detection by the sensors. In an alternative arrangement in which contact(s) are on one side (e.g. top or bottom) of the DUT substrate and the DUTs are on the other side (e.g. bottom or top)—a so-called "flip chip" design—then probe interference with light emitted from the microLEDs may not be such a concern.

Figure 11:
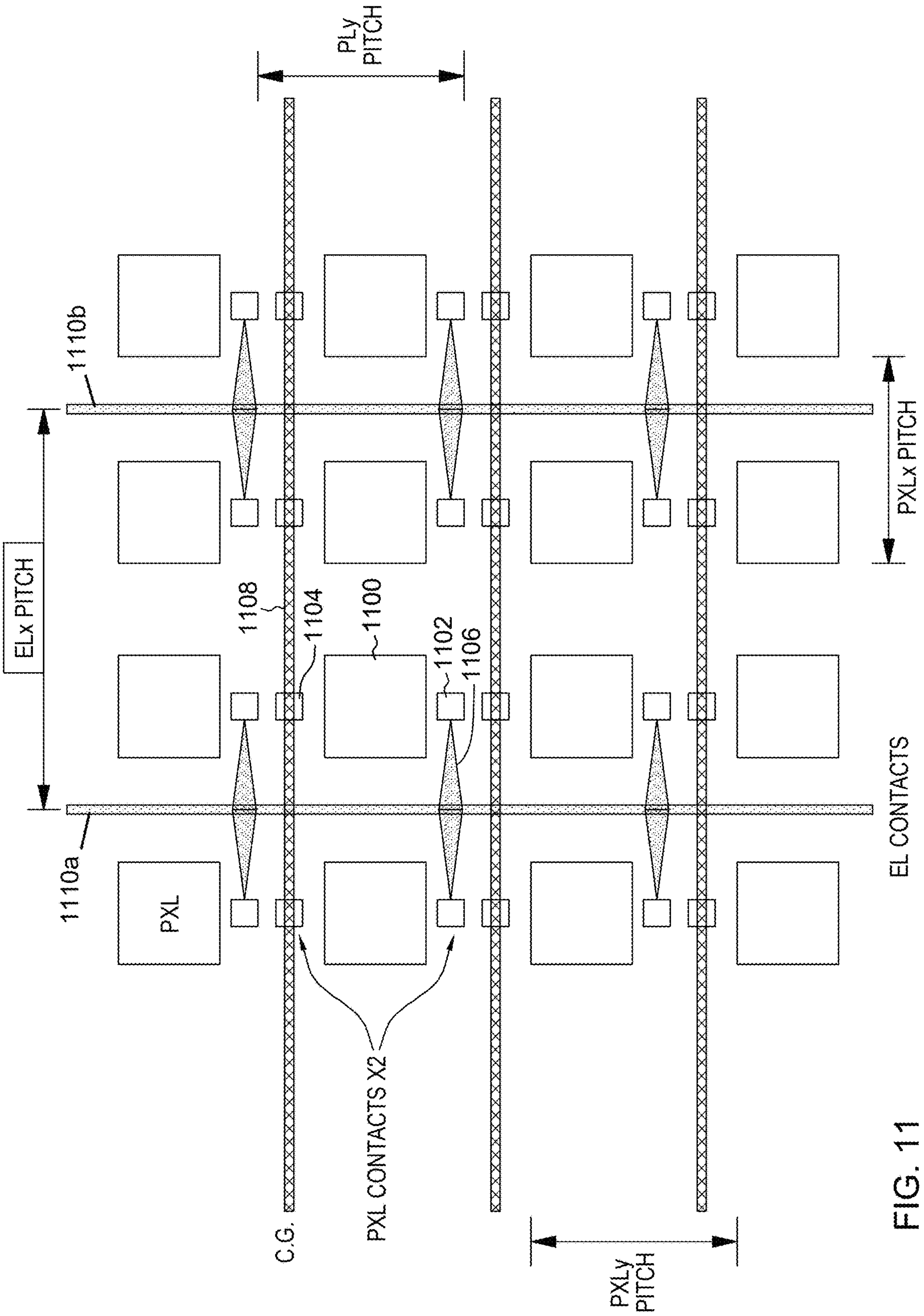
FIG. 11 depicts another example environment and components thereof to incorporate and use aspects described herein.

FIG. 11 depicts another example environment and components thereof to incorporate and use aspects described herein. FIG. 11 depicts a segment of a device array and corresponding segment of the test tool for testing the segment of the device array. Here, the segment of the device array includes a 4×4 array of (sixteen) devices 1100. PXLx PITCH refers to the pitch (spacing) between devices 1100 in an x-dimension (horizontal direction in FIG. 11), while PXLy PITCH refers to the pitch in a y-dimension (vertical direction in FIG. 11).

The depicted portion of the test tool includes two electroluminescence (EL) contact probe arms 1110*a* and 1110*b*, each with 6 probes extending therefrom, and more specifically each with three probes extending to contacts on one side (e.g., the left side) of the EL contact probe arm and three probes extending to contacts on the other side (e.g., the right side) of the EL contact probe arm. Configuring the probes along each EL contact probe arm in this manner enables the EL probe arm to probe devices on each of the two sides of the arm, and therefore to run an EL contact probe arm in the y-dimension between every other column of the device array, as shown, with corresponding pitch (ELx PITCH) in the x-dimension. Meanwhile, probes on a same EL contact probe arm are spaced in the y-dimension according to the spacing (Ely PITCH) of excitation contact points for the devices.

Each device 1100 has a respective two associated contact points. Using device 1100 labeled as such in FIG. 11 by way of example, device 1100 has an associated first contact point 1102 and an associated second contact point 1104. Contact 1102 is the contact to excite device 1100 via probe 1106 extending from EL contact probe arm 1110*a*. Contact point 1104 is a common ground point that is electrically connected via a common ground (CG) line to other ground contact points for the devices 1100 in the same row (x-dimension). In this example, Elx PITCH=2*PXLx PITCH, Ely PITCH=PXLy PITCH, and the common ground line may be on the wafer (not shown) to which the devices 1100 are coupled.

Figure 2:
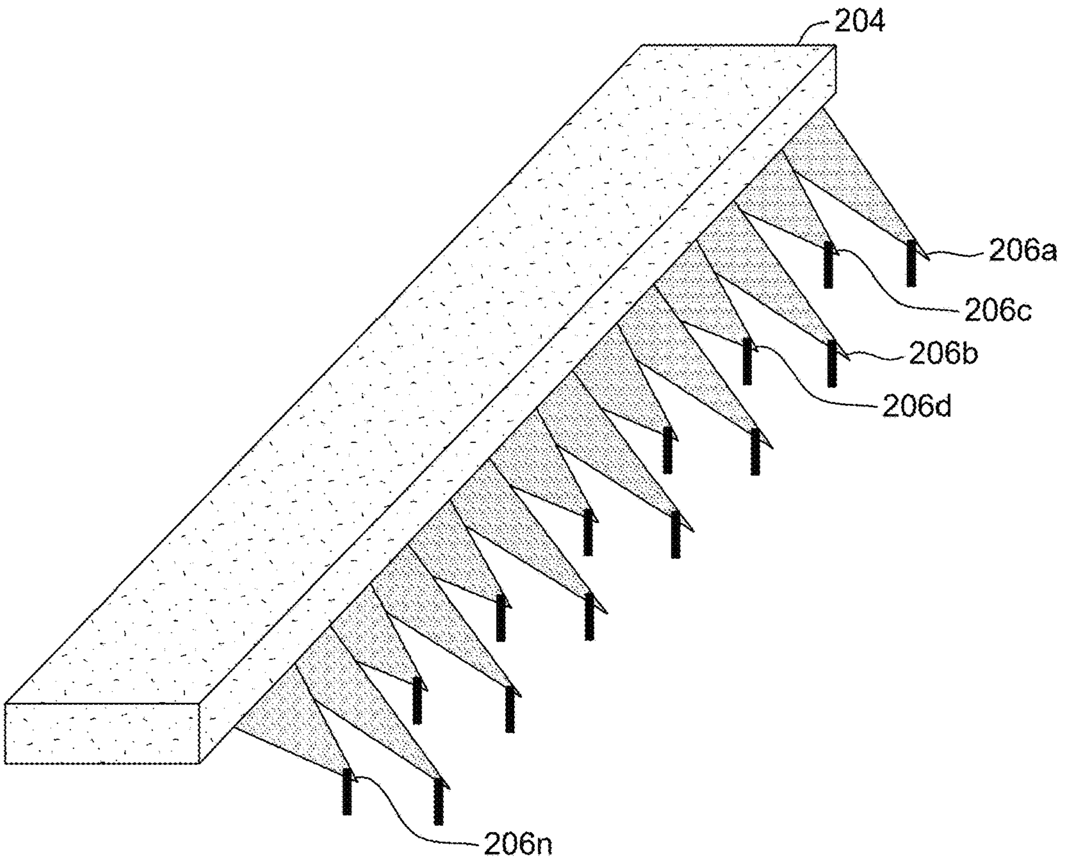
FIG. 2 depicts an example of an alternative arrangement of an array of probes extending from a probe array arm, in accordance with aspects described herein.

FIG. 2 depicts an example of an alternative arrangement of an array of probes extending from a probe array arm 204. Here, probe array arm 204 provides cantilever probes in pairs, with each pair being configured and sized to provide contact and electrically interact with the two contacts associated with a given device under test (e.g. a microLED). The probe array arm 204 provides two rows of probes-one row of probes that are each a first length and another row of probes that are each a second length, the first length being longer than the second length. Probes 206*a* and 206*b* in the row of longer probes are to provide the two contacts for testing a first device 1100 (such as by straddling the device to reach a respective contact on each side of the device), while probes 206*c* and 206*d* in the row of shorter probes are to provide the two contacts for testing a second device 1100 (such as by straddling the device to reach a respective contact on each side of the device). Various other pairs of probes depicted are used for testing other devices 1100 or for alternate geometries to test devices.

Figure 3A:
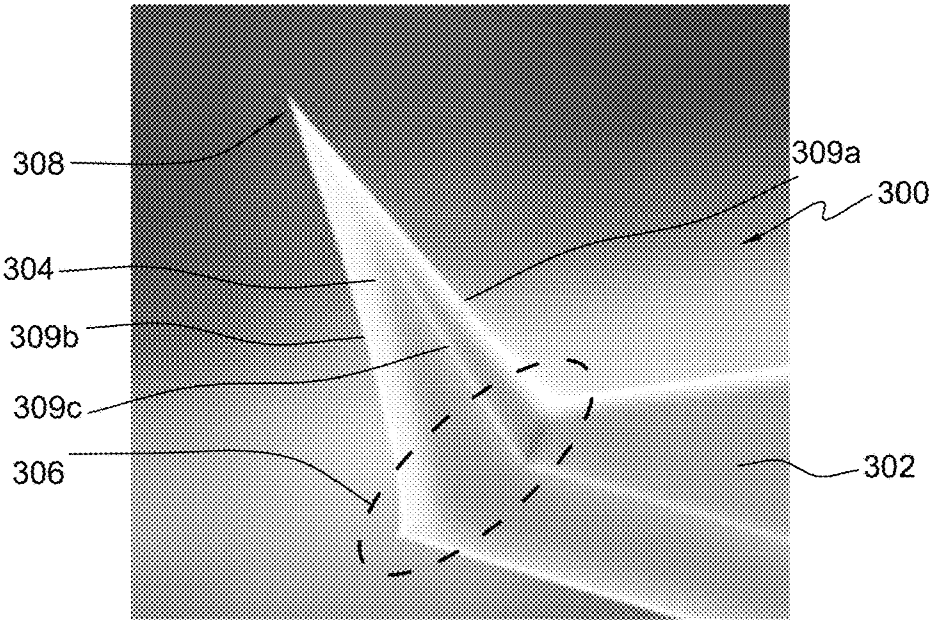
FIGS. 3A-3B depict additional examples of probes in accordance with aspects described herein.

FIG. 3A depicts another example of a probe in accordance with aspects described herein. The probe 300 may be cantilevered relative to a probe array arm (not pictured), for instance with a protruding body portion 302 extending at a first angle from the probe array arm and a tip portion 304 forming an end of the probe that extends at another angle relative to the first angle, i.e., at an angle relative to body portion 302. A change of direction is thereby provided at area 306, which is an interface between the body portion 302 and the tip portion 304, when moving along the probe from a base end from which the probe extends from the probe array arm to the end/tip of the probe. It is also noted that in this example the probe is configured with generally flat surfaces of narrowing dimension that converge at the probe tip 308, resulting in edges 309*a*, 309*b*, 309*b* running along the probe in a direction of extension thereof. It may be preferable in some applications that the probe/probe tip protrudes outward and away from a coupled structure (such as the probe array arm) so as to not obstruct the optics/line of sight to view the effect of the electrical excitation.

Figure 3B:
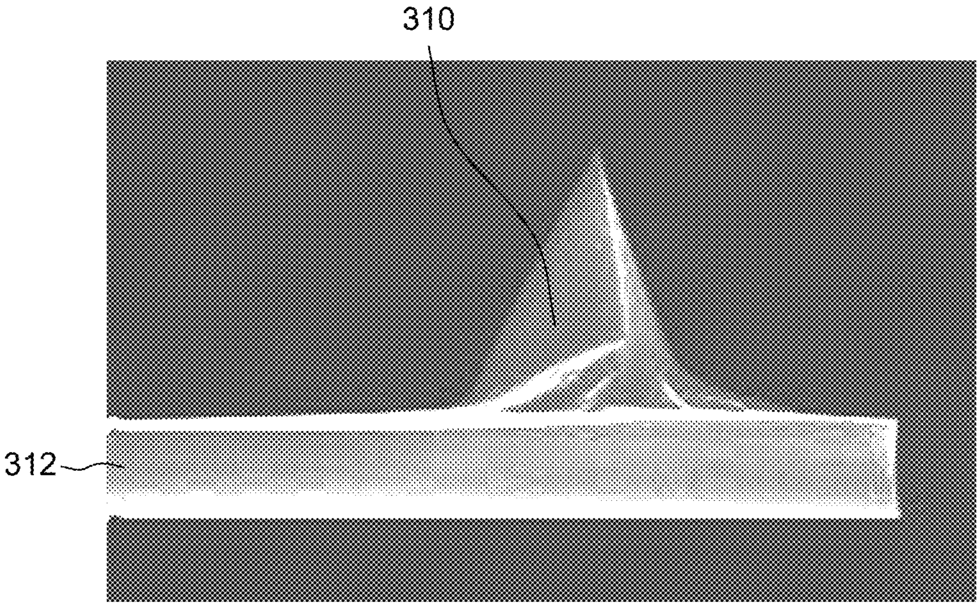

FIG. 3B depicts another example of a probe in accordance with aspects described herein. Here, probe 310 with an end extends from probe array arm 312 in a generally singular direction (vertical and with proximity relative to the end of the probe array arm in the example of FIG. 3B). This is in contrast to the geometry in FIG. 3A, in which there is a bend in the probe 300. This configuration may be useful in situations where a contact pad is on one side of the DUT and the excitation characteristic (emitted light for instance) is observed from the other side of the DUT, where a bend or curve of the probe is not needed in order to provide greater optical exposure to the excitation characteristic.

In any case, probes can be a unitary element and, in some cases, formed from a single or multiple materials. In examples, the material(s) comprise with one (or more) conductive material(s). It is noted that probe/material does not have to be fully conductive; in examples, the probe(s) comprise silicon with a coating of gold (or other material). However, in terms of material/composition (and as explained elsewhere herein), probe(s) may have a channel through which liquid conductive material is provided to the probe end and through an opening thereof to provide a droplet of liquid conductive material. By way of specific example, the probes can be made, partially or wholly, of silicon, silicon nitride, polymer(s), etc. At least some of the foregoing materials (e.g., at least silicon nitride) is known to be translucent. Materials may need to be appropriately coated such that they provide high conductivity. In addition, in some embodiments the probes are to have a force constant selected to allow for appropriate flexibility such that when they touch and press against contact points they do not break and do not cause undue damage to the DUT. Factors in accomplishing this include appropriate material selection, appropriate geometry, and appropriate dimensioning of the probe, probe array, and frame/support structures for the probe array. Different geometries for cantilever probes with different distributions and/or lengths and pitches are described herein.

It is also noted that while flexibility in part or all of the probe may be desired and/or necessary, a high enough force constant at least at the probe tip may be desired in these situations to maintain the probe tip structure when it physically interacts with the contact pad. As described elsewhere herein, flexibility or lack thereof may be irrelevant and optional in some situations, for instance when a liquid conductive material is provided in conjunction with a probe as described below.

In accordance with aspects described herein, electrical connection/coupling between a probe tip and contact pad to provide electrical excitation may be provided with variable separation of the probe tip itself from the contact pad. This may be provided without compromising conductivity, yet while still providing effective, repeatable, and uniform excitation of the devices under test. For such a contact, a conductive liquid material, such as a liquid metal, may be used. Thus, in accordance with some aspects, liquid conductive material is applied, while still at least partially in liquid form, to the probes prior to their contact with contact pads of the DUT. One method of applying such liquid conductive material to solid probes is to dip the protruding probes into the liquid conductive material. Such an operation can be accomplished without damage to the array/probes thereof. The conductive material in liquid form adheres to outer surface(s) of the probe and forms a relatively highly-conductive liquid buffer on the outside of the probe tip.

By way of specific example and not limitation, liquid gallium may be used for its high conductivity and other convenient properties, including its melting point (at about 30° Celsius). While examples described herein indicate gallium as the liquid conductive material, this is just one non-limiting example and does not exclude use of other conductive materials such as metallic inks or conductive solutions either now existing or to be later developed. In general, the conductive material may be selected for its conductive, mechanical, physical and/or elastic properties depending on the particular application in which it is being used. Gallium is a liquid metal at temperatures that are convenient for production processes around room temperature and has unique properties that are well-suited to applications such as microLED inspection.

Figure 4A:
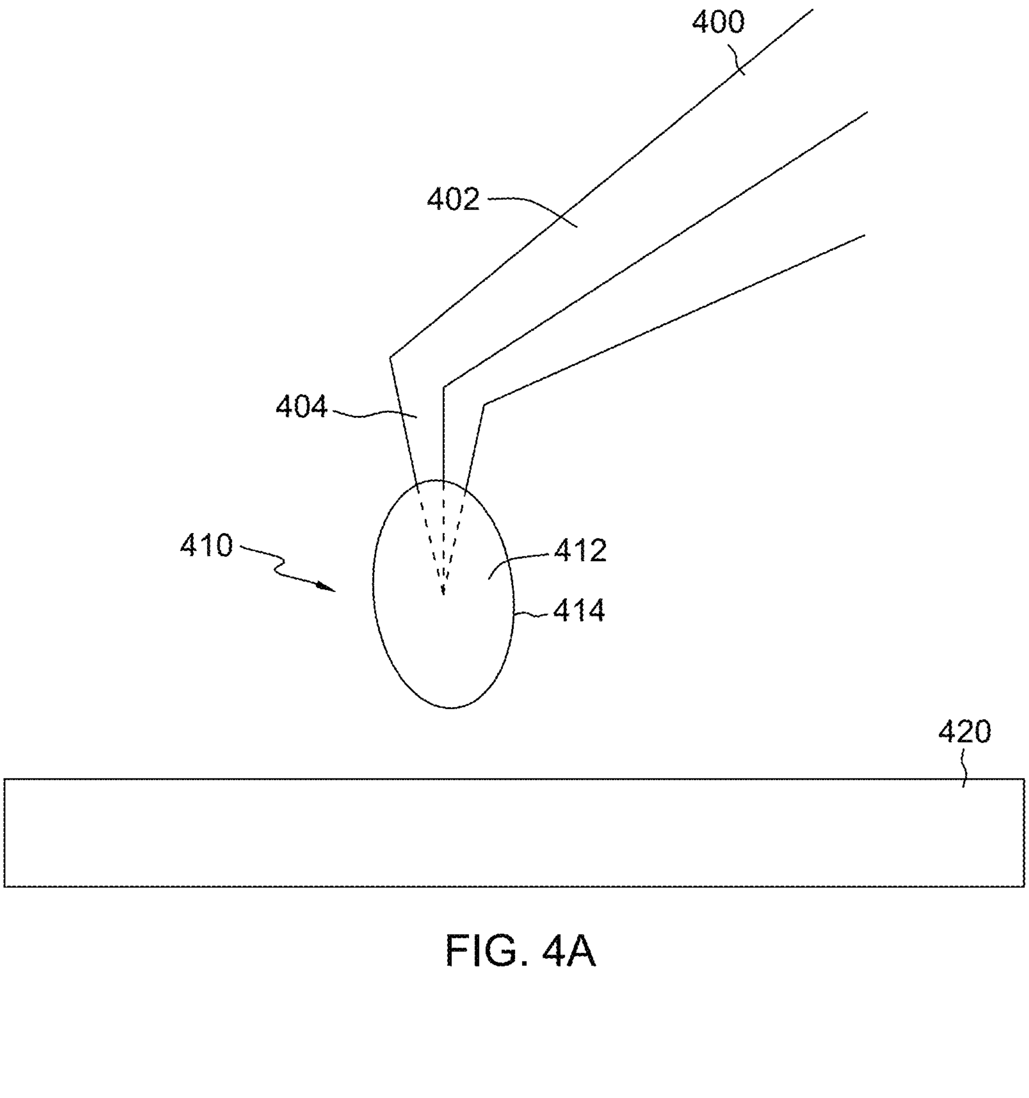
FIG. 4A depicts an example of a probe tip that has been dipped into, and then withdrawn from, a liquid conductive material in accordance with aspects described herein.

FIG. 4A depicts an example of a probe tip that has been dipped into, and then withdrawn, from a liquid conductive material in accordance with aspects described herein. The probe 400 has a body portion 402 and tip portion 404, and the tip portion 404 has been partially dipped into, then withdrawn from, a pool 420 of liquid gallium. As a result, a droplet 410 of the liquid gallium remains on the probe tip 404 surrounding a portion thereof.

A 'bag' in the form of a liquid droplet forms and adheres to the probe tip. Depending on physical and/or chemical processes/changes that may occur after withdrawing the probe tip from the liquid gallium (which physical/chemical changes may depend on the environmental and other conditions under which testing occurs) a relatively thin (e.g., micrometric or nanometric) protective layer 414 of droplet 410 might form. An example of such a chemical change could be, for instance, formation of a molecular gallium-oxide layer of, for example, a few nanometers in thickness. Additionally or alternatively, other change(s) in the gallium at the probe tip might occur, for instance partial solidification ('cooling') of the liquid gallium at the surface of the droplet to produce layer 414 and/or make the droplet partially/wholly a malleable solid, as examples.

Meanwhile, the interior 412 of the 'bag' can remain liquid gallium protected by the protective layer 414. Using the example of oxidation to produce an oxide bag with protective oxide layer 414, the layer 414 can prevent and protect the interior liquid gallium 412 within the oxide bag from further oxidization or rust, as one example. The ability to form an oxide-coated conductive liquid conductive material (e.g. gallium) micro/nano droplet that seals the probe tip is a result of the high degree of compliance of gallium (or similar liquid metal). The bag formed and having the oxide layer acts like a bladder except that, if punctured, can rapidly reseal. The dimension of the droplet and its bag periphery conforms to fit around the probe tip and conforms to the surface that it touches as described herein, and so the dimension of the bag and oxide surface 414 (in these examples) may be, at least in part, a function of the size of the probe tip.

The probe 400 so coated after being dipped into the liquid conductive material can be lifted/withdrawn from the pool 420 without the seal around the tip breaking, and this may be due at least in part to the presence of the layer 414 (e.g., nanometric oxide layer) of the bag around the tip, which might itself have a protective coating applied to it.

In some examples, liquid conductive material is instead (or in addition) introduced to ends of the probes by way of a channel, conduit, passageway, or other feature of the probe itself, e.g., through the probe body and to the probe tip, as an example. For instance, the probes could be partially hollow and liquid conductive material could be delivered to and through an opening on an end of the probe, akin to ink being delivered through the body of a pen to a tip thereof. The liquid conductive material can originate from a reservoir from which the liquid conductive material flows or otherwise is provided to a channel/conduit/passageway extending through the probe in order for liquid conductive material to flow through the probe to an end thereof. The reservoir could supply the liquid conductive material for multiple probes. In examples, a droplet of the liquid conductive material forms on the end of each test probe when the liquid conductive material is delivered to/through the opening at the end of the probe.

Droplets of liquid conductive material on an array of probe tips, whether formed by dipping or provision through the probe itself to the end thereof, can facilitate alignment and leveling of the probes in their interaction with the electrical contacts of the device under test and can also enable proper leveling and alignment without active feedback. As the probe tip with a conductive material bag is moved closer to the appropriate contact of the DUT, the portion of the bag opposite the probe tip (e.g. the bottom of the bag) can come into contact with the contact pad of the DUT, and thus the conductive material (as opposed to the probe tip itself) first interacts with the contact pad. This can itself produce a chemical and/or physical change in the conductive material, for instance the formation of nanoholes in the oxide (in this example) portion of the bag, and enable the probe tip to make electrical contact with the contact pad via the conductive material of the droplet and without the probe tip actually physically touching the surface of the contact pad. Meanwhile, the liquid state of the conductive material provides a buffer or ‘cushion’ for the probe tip such that it does not meet the level of resistance it otherwise would if it touched the (solid) contact pad or if the conductive material on the tip were solid.

Electrical interaction and/or contact between the probe tip and contact point is thereby provided without the probe tip making physical contact with the contact point. Thus, the tip of the probe can thereby electrically interact with the contact of the DUT without physically touching the contact or any other portion of the DUT, as the conductive material acts as a medium for electrical communication/connectivity between the tip and the contact point of the DUT. Furthermore, due to the effective separation between the probe tip and the contact, the conditions can allow for a tunneling current to be induced from the tip to the surface as a function of voltage.

Figure 4B:
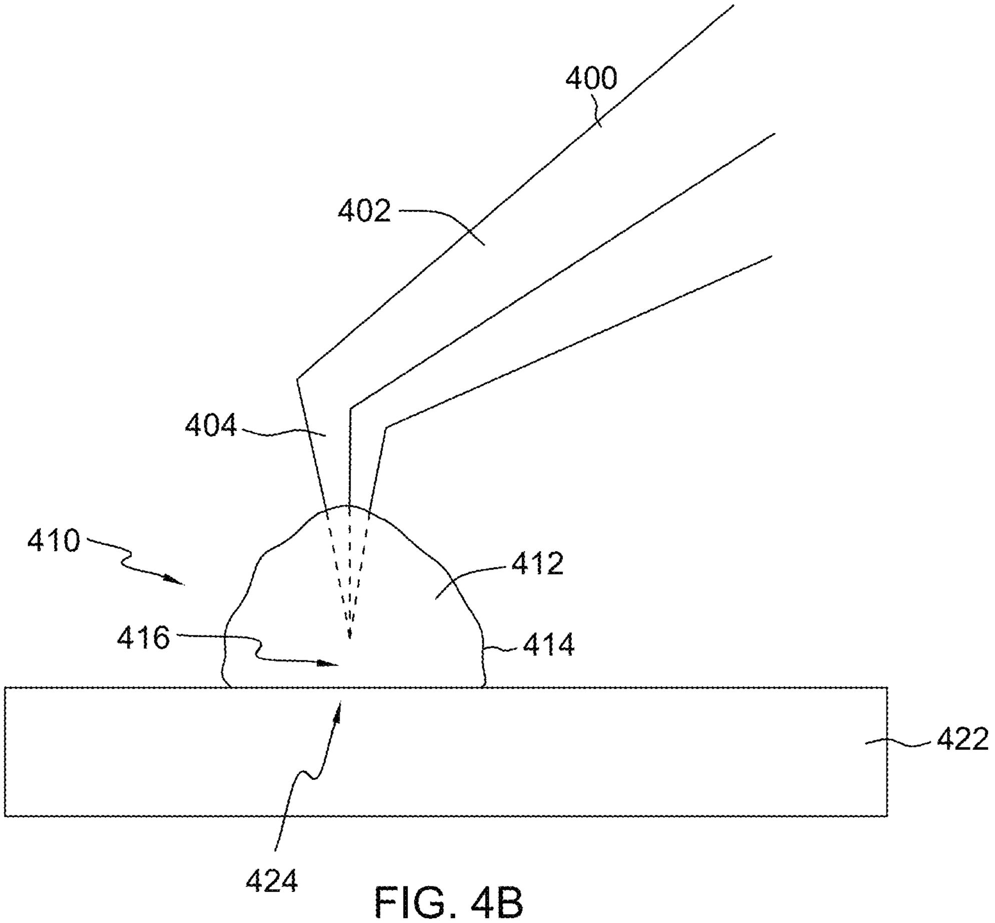
FIG. 4B depicts an example of electrical coupling between a probe tip with conductive material on an end thereof and a flat contact, in accordance with aspects described herein.

FIG. 4B depicts an example of electrical coupling between a probe tip with conductive material on an end thereof and a flat contact, in accordance with aspects described herein. As shown, the probe 400 with the liquid conductive material 412 has been positioned relative to a contact 422 (that is, in electrical communication with a device for testing) such that the droplet 410 of the liquid conductive material 412 physically touches the contact 422 at a continuous plurality of points on the flat contact area 424. The droplet 410 becomes deformed (relative to its shape in FIG. 4A) as shown, and a space 416 exists between the contact 422 and the end of the probe tip closest to the contact 422 (i.e., at the end of the probe). The conductive material nonetheless electrically couples the probe to the contact 422 despite no direct physical contact between any portion of the probe and the contact 422.

In embodiments, pinhole(s) can develop in the oxide layer of the bag when the probe with a liquid conductive material droplet contacts the DUT contact pad. These pinholes allow the liquid conductive material to act as a contacting bridge between the probe tip and the pad on the DUT. Under this condition, the outer oxide layer can act to contain the liquid conductive material interior so that the liquid does not flow onto the surface of the contact pad and substantially away from the probe tip. Furthermore, to the extent that the probe tip may have been further pressed/moved toward the contact pad through the droplet to ‘puncture’ the oxide layer interfacing the liquid material and the contact pad, when the probe tip is lifted from the contact any such pinholes can seal. That is, they may quickly and automatically repair by way of chemical and/or physical process(es) associated with the liquid conductive material—gallium in these examples—for instance by reoxidation or oxide phase changes, as examples when drawing the probe back away from the DUT.

Accordingly, portions of the probes, for instance the probe tip(s), portion(s) thereof, and/or other portions of probes, can be introduced into, and then lifted from, a pool of gallium or other liquid conductive material to provide droplet(s) on the probes, and/or the droplet(s) may remain intact around the probes (tip(s) in these examples) due to the presence of a nanometric oxide portion of the bag. As a result, the probe(s) can be moved readily from the dipping liquid to the sample (e.g. DUT) without losing the liquid. Additionally, the probe(s) could, after exciting one or more devices, be lifted away from the corresponding contact point(s) and retain the droplet of liquid conductive material thereon. Any conductive material that may have leaked onto the contact point(s) may be negligible. The array and sample can then be repositioned relative to each other without the probe(s) losing the liquid in order to enable testing to be repeated for other DUTs, for instance by moving the probe array and/or by moving the sample under the probe array to facilitate probe interaction with another group of contact point(s). If needed the probe array could be re-dipped into the gallium between repositioning.

These aspects can help eliminate or minimize wear and other degradation of probe tip(s) while achieving repeated, flexible contact with the DUT and resolving a general problem in single or multiple probe interactions with a device. Additionally, electrical contact with the DUT can be maintained with or without the aid and guidance of feedback, since electrical contact with the DUT can be accomplished without the probe tip(s) physically contacting the surface(s) of the contact pad(s). In this regard, embodiments see the probes operating in a non-contact mode, in which a probe/probe tip itself does not make physical contact with the contact point but instead electrical communication occurs through a conductive material in the form of a liquid droplet that electrically couples the probe tip and the contact point, and this coupling and any associated leveling/alignment between the probe(s) and DUTs may be achieved without the use of active feedback and in a tunneling mode with the contacts of the DUT.

It is noted that the probes, being electrically-conductive in order to provide the electrical excitation of the devices under test, have electrically-conductive portion(s) thereof. In the above examples, the probes are electrically-conductive at the extreme ends of the probe tips and therefore a droplet, formed around a probe tip, provides a conductive medium from the probe tip to the contact point(s) with which it engages. However, in some examples the extreme end of the probe is not necessarily electrically-conductive but other portion(s) are. The droplet of liquid conductive material can therefore be large enough such that it is in electrical contact with electrically-conductive portion(s) of the probe. In this regard, the depth to which the probes are dipped in the liquid conductive material and/or the portion of a probe that is dipped into the liquid conductive material may be based on the location(s) of the electrically-conductive portion(s) of the probes and, in examples, how large a droplet is desired, to ensure that electrical conductivity exists between the probe itself and the liquid conductive material so that electrical communication from the probe to the contact pad is made when contact between the conductive material and a contact pad is made. In this manner, submerging at least a portion of a test probe in a liquid conductive material and withdrawing the probe therefrom can provide a droplet of the liquid conductive material that remains on an end of the test probe and that is in electrical contact with an electrically-conductive portion of the test probe. The liquid conductive material on the end of the test probe can make physical contact with a respective contact point and then an electrical signal can be delivered via the test probe to the respective contact point through the liquid conductive material.

Properties and characteristics of gallium make it a good candidate liquid conductive material for applications discussed herein. Gallium is very electrically conductive, boils at 2400° Celsius, melts at about 30° Celsius, and has very low to effectively zero vapor pressure at room temperature. Low vapor pressures can cause a liquid to evaporate but in the case of a gallium droplet the oxide layer described above prevents this from occurring. Gallium can be used in air without risk of inhalation, resulting in low toxicity. Additionally, Gallium has a low viscosity, which would normally allow it to flow freely but the oxide coating prevents it from flowing and gives gallium a high surface tension. Gallium has been approved by the United States Food and Drug Administration for human applications, such as magnetic resonance imaging for example. Moreover, the human body has a natural ability to remove gallium. Characteristics of gallium also facilitate ease of cleaning and removal, enabling, for instance, the gallium material to be removed from the probe tips/ends/portions with high repeatability or if by chance needed to remove any residue on the DUT. For these and other reasons, gallium may be substantially safe for industrial application with little or no personnel protection required, and therefore may be ideal in certain applications of embodiments of aspects described herein.

In addition, in situations where it is desired in the processes of inspection, use of gallium can allow the probes to be reversibly bonded to the contact surfaces via an adhesive bond in which the liquid gallium at least partially solidifies to adhere to the contact surface. The adhesive bond may be reversed remotely using infrared radiation or heating (for instance electrical Joule heating through conductive wiring integrated into the tool), as examples. The temperature for such reversible adhesion may be about 23° Celsius (depending on environmental and other conditions), in which temperatures above this result in clean detachment of the gallium from surfaces with minimum adhesion.

These characteristics of gallium, whether used as a conductive bridge allowing for non-contact, highly conductive electrical interaction between a probe and a device under test or as an adhesive, render it useful across many cycles (contact, excitement of device under test, lift/move, repeat, etc.) without replacement because the liquid metal substantially lifts from the contact surface under proper loading and unloading conditions. No residues are left on the contact surface and (in the case of adhesive bond) the adhesive loses little to none of its own substance. Good adhesives are generally hard to separate from the substrate, but the oxide shell of gallium (in this example) can help facilitate this removal with minimal or no residue left on the device. Such a characteristic may be critical to the application of electrical contact and/or interaction.

Thus, gallium (and similar metallic elements) with, relatively, low melting point, high conductivity, negligible vapor pressure, high surface tension, low viscosity, and metallic properties may be good candidates for the liquid conductive material. In addition, what has been historically considered a hindrance in the use of gallium for various applications, namely the reactivity of gallium to form oxides, is a benefit in the context of applications discussed herein.

As noted, gallium is only one example of a conductive material; others may work equally well or better depending on the particular application. Example alternative liquid metals that may be appropriate include, but are not limited to, eutectics of gallium and/or indium, Gallium-Indium-Zinc, and Gallium-Indium-Tin, as examples. Other still-to-be-developed liquids with high conductivity could replace the use of gallium.

Figure 5A:
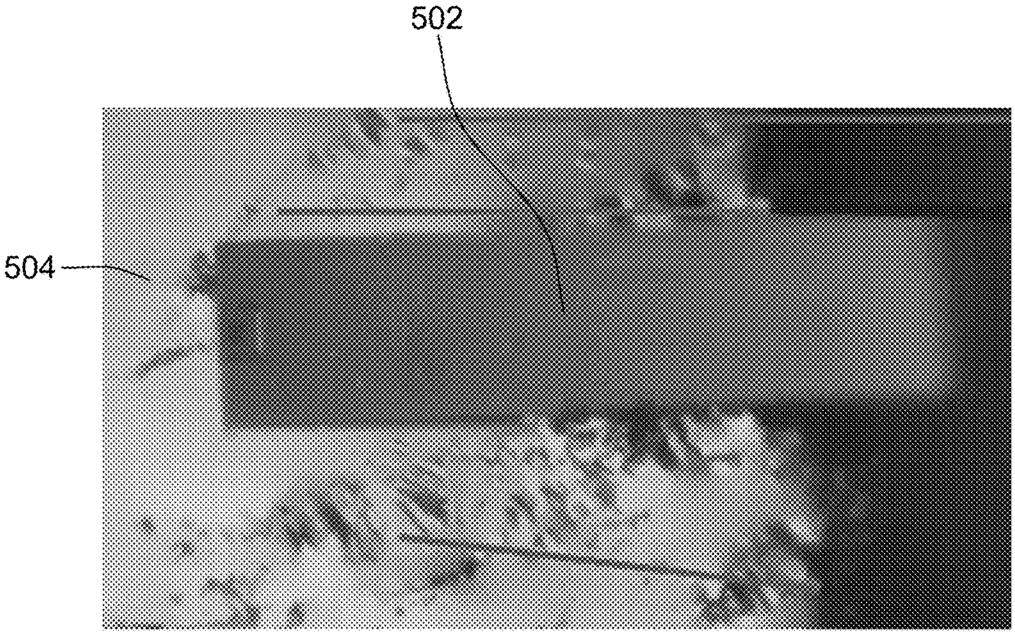
FIGS. 5A-5B illustrate observable changes based on a probe tip being dipped into a liquid conductive material, in accordance with aspects described herein.
Figure 5B:
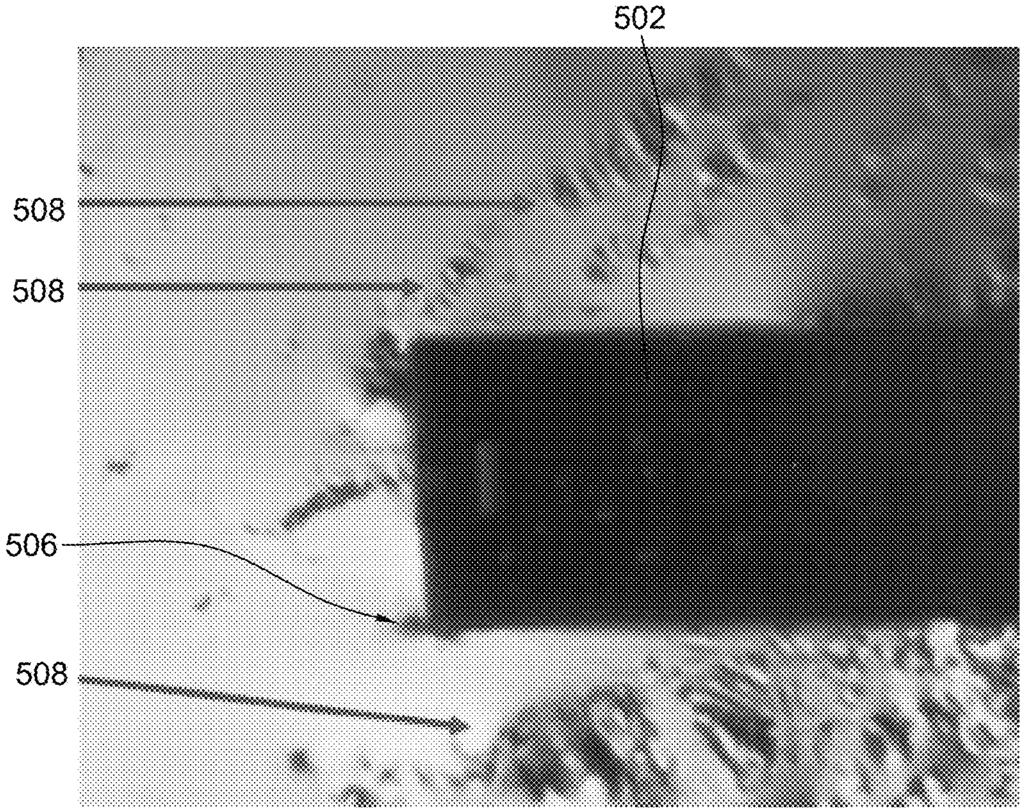

FIGS. 5A-5B illustrate observable changes based on a probe tip being dipped into a liquid conductive material, in accordance with aspects described herein. More specifically, they illustrate dipping a probe into liquid gallium. The semi-flexible cantilever probe 502 is shown in an overhead view with the probe tip beneath (not seen) the probe body in these examples. FIG. 5A depicts probe 502 prior to the probe tip being dipped into a pool 504 of liquid gallium and FIG. 5B depicts probe 502 after the probe tip has been dipped and remains at least partially submerged in the pool 504 of gallium.

As the probe 502 is moved closer to the pool 504, the probe tip is attracted to the gallium and, as a result, is pulled toward the pool 504 and then dips into the gallium. Flexibility in the probe may facilitate bending/flexion to pull the tip into the liquid gallium, and this flexibility aids the probe tip interaction with the gallium pool.

This results in a change in the reflection of the flexible cantilever probe as seen in FIG. 5B where the probe appears much darker in color. Thus, when the probe tip enters the liquid metal the flexible cantilever bends and the reflection of light from the cantilever, as viewed with an objective from directly above, changes. This serves as an indication that the probe tip is appropriately dipped in the liquid metal. Even if the reflecting light is not directly above the probe cantilever, it has the potential to be altered due to the tip entering into the liquid metal. Ripples (506) in the gallium may be additionally or alternatively detected to inform when the probe tip has entered the pool 504. This change may generally be local to the probe tip, as other, more distant regions 508 of the liquid may not be as sensitive since they are displaced from the probe tip.

Figure 6A:
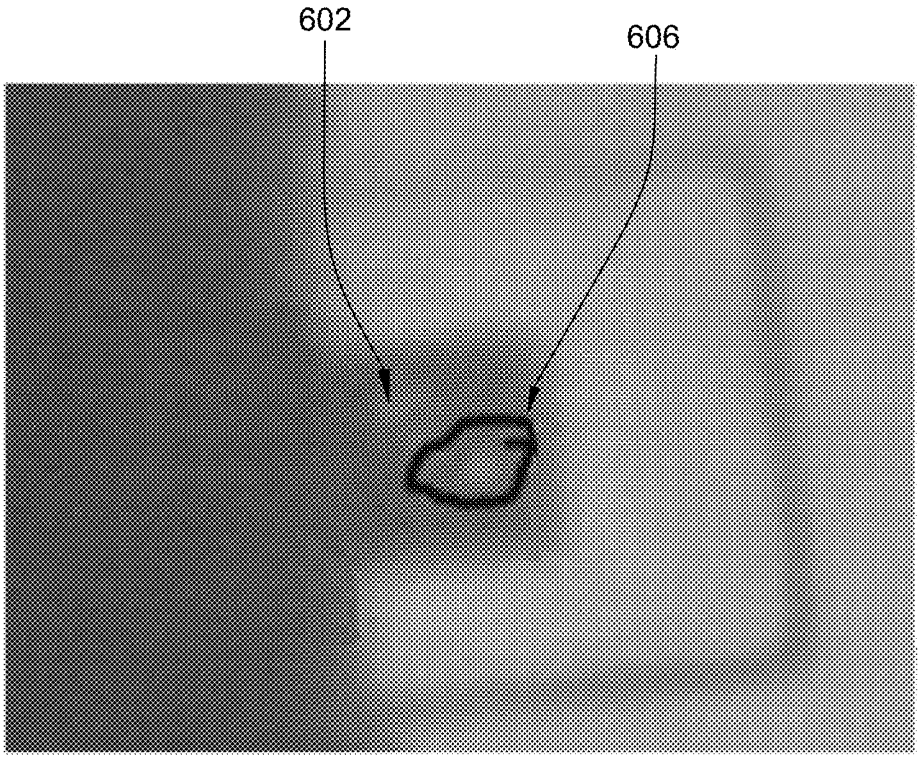
FIGS. 6A-6C illustrate further observable changes based on a probe tip being dipped into a liquid conductive material, in accordance with aspects described herein.
Figure 6B:
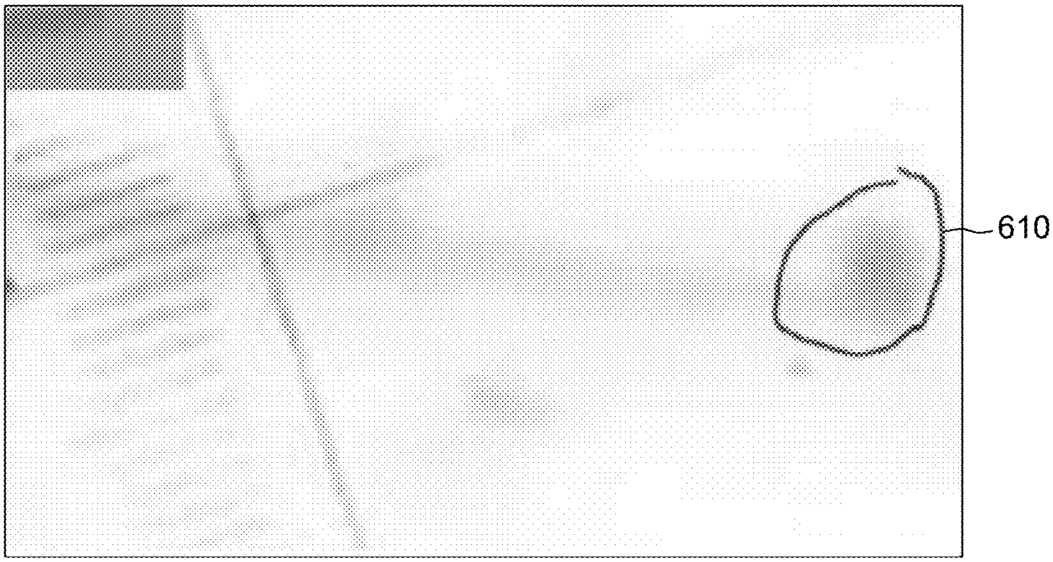

FIGS. 6A-6B illustrate additional observable changes based on a probe tip being dipped into a liquid conductive material, in accordance with aspects described herein. In each of FIGS. 6A-6C, the probe tip is presented facing up toward an objective of a microscope and the illustration shows a view of the probe tip through the objective. In FIG. 6A, the tip was checked after dipping the probe tip in gallium in an environment and conditions in which the gallium was in a liquid state at room temperature. The darker rectangular portion 602 is the probe, and a region 606 of the coating on the tip that extends from the probe arm is identified. The probe tip indicated by the smaller circle area 606 appears as a different shade due to the liquid conductive material coating. With a higher numerical aperture objective, the tip is viewed in more detail in FIG. 6B. The amorphous material seen on the tip at 610 is the liquid gallium coating. These illustrations indicate a high level of control in terms of coating just a small portion of the probe.

Figure 6C:
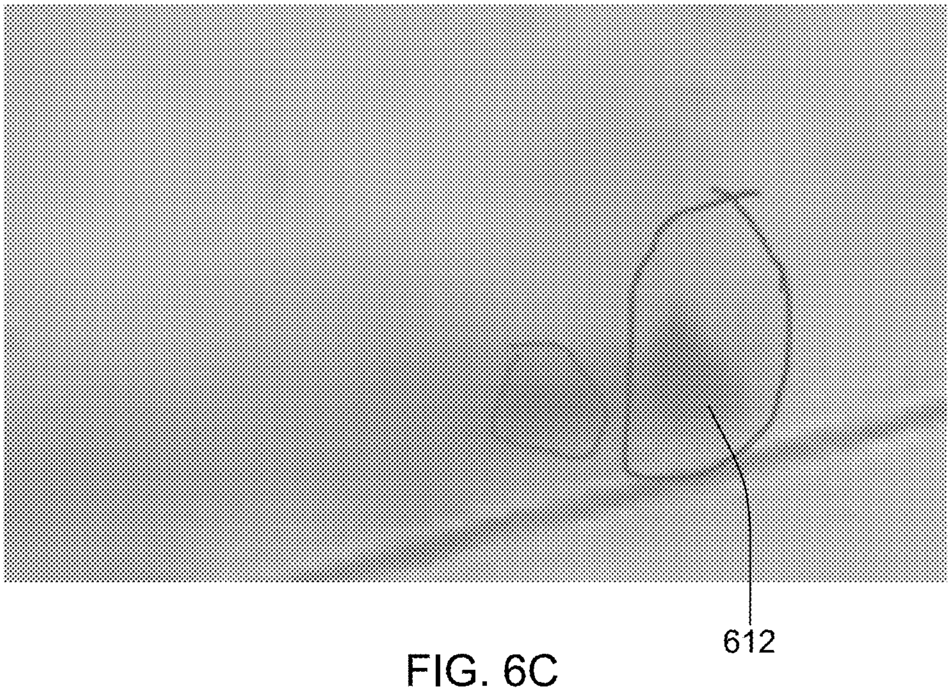

If desired, the probe can be readily washed to remove the liquid metal, e.g. with a hydrogen chloride or other solution. The result of such washing is seen in FIG. 6C. Comparing FIG. 6B (before the washing) to FIG. 6C (after the washing), the pyramidal probe tip 612 shape is clearly visible in FIG. 6C indicating that the conductive material from the dipping has been readily removed.

Figure 7:
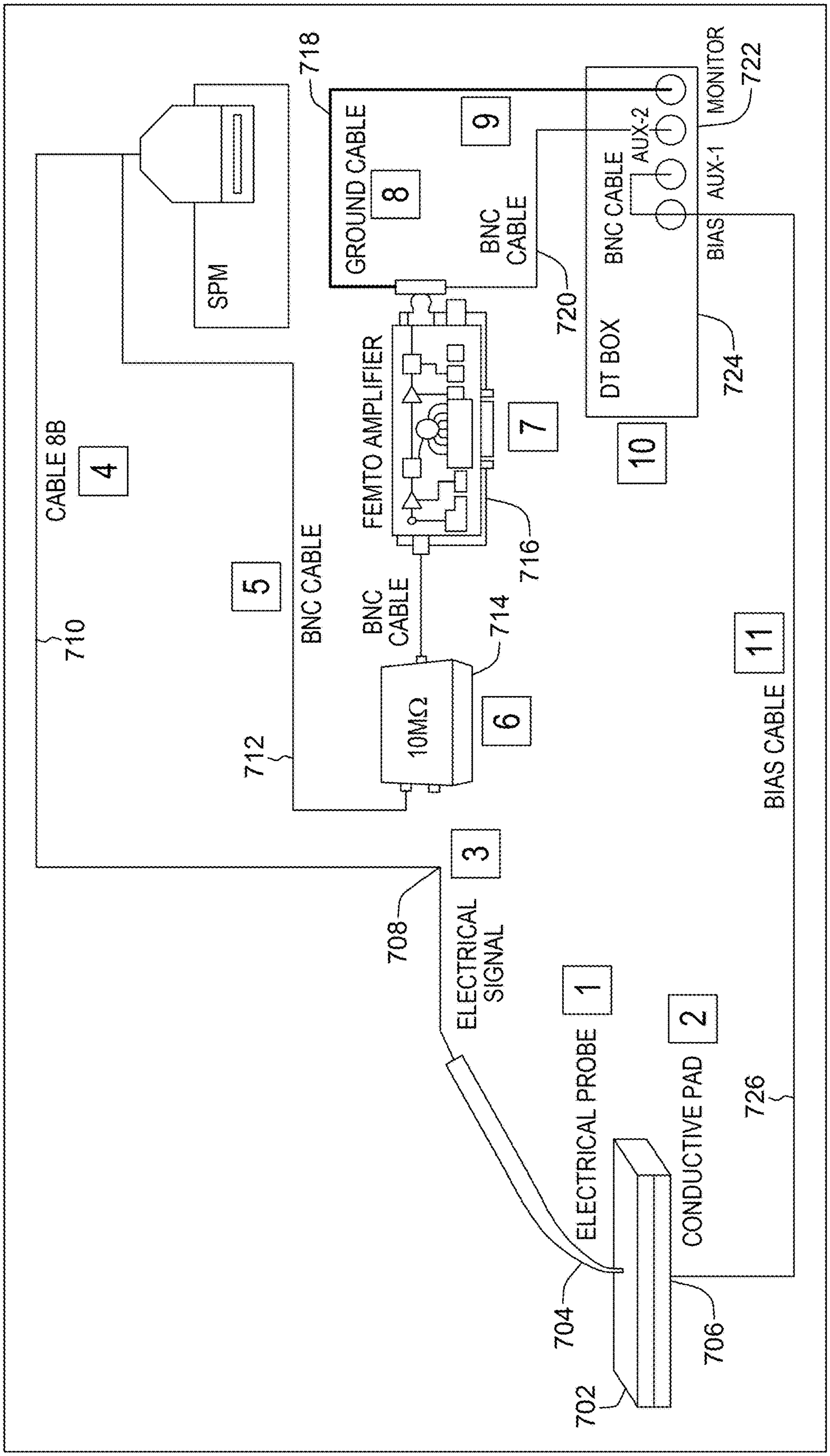
FIG. 7 depicts an example test device and setup for DUT measurement, which can incorporate aspects discussed herein.

FIG. 7 depicts an example test device and setup for DUT measurement and that can incorporate aspects discussed herein. FIG. 7 illustrates a basic electrical circuit through which the probes may be connected. Shown is a case with only one probe 704 that probes the DUT 702 at any given time. The DUT includes a contact pad sitting on a substrate. The substrate incorporates a counter-contact point at 706.

The electrical probe 704 can make contact with the DUT, for instance either directly or through a liquid metal bridge as described herein, on a conductive pad of DUT 702, which is an electronic, optoelectronic, or electromechanical device, as some examples. An electrical signal 708 is conducted through connection cables 710, 712 to a resistor 714 and an amplifier 716 into a ground 718 and a BNC cable 720 to an auxiliary input 722, which is within a DT box 724 that has an auxiliary output and provides a bias via bias cable 726 to a second contact at 706 on the DUT. This is just one example environment for imposing an electrical signal on the DUT.

Figure 8A:
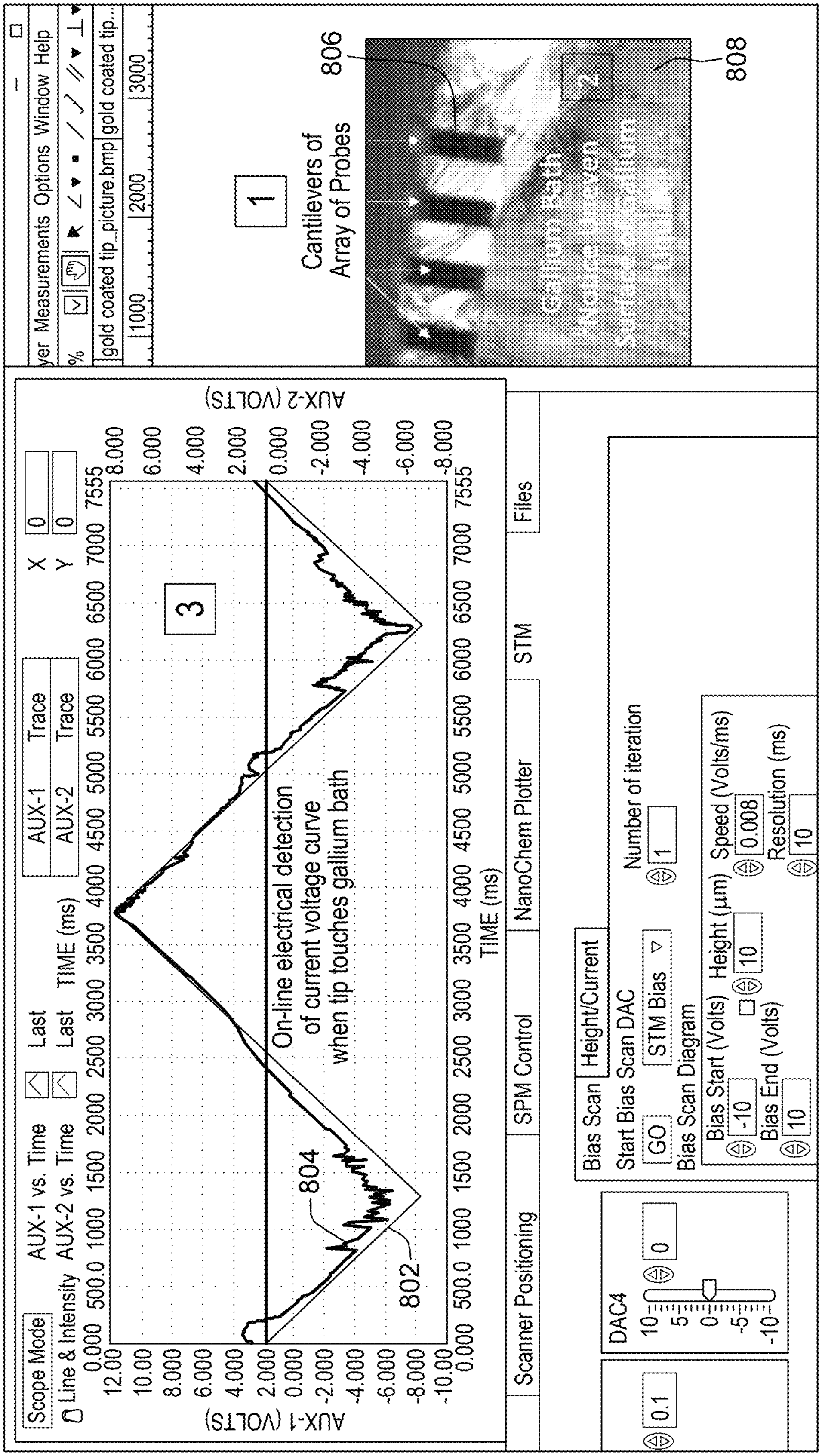
FIGS. 8A-8C depict example electrical and optical indicators of electrical conduction status of probes, in accordance with aspects described herein.

Electrical interactions between probes and conductive material, such as the liquid conductive material and contact pads/points of a DUT, can be tracked using an appropriate electronic device that can monitor voltage/current signals. As noted, this can be signals produced when the probes are dipped in liquid conductive material and/or when in electrical coupling any other conductive surface, such as a contact pad. FIG. 8A depicts an example current voltage curve when a probe tip touches a liquid bath or conductive surface. Plot 802 represents an applied voltage and plot 804 represents the excitation response (current) that is measured with the probe tip (e.g. of probe 806) contacted with a conductive material be it a liquid metal or a conductive surface 808 or a probe tip in the liquid metal which bridges its contact with the conductive surface.

Figure 8B:
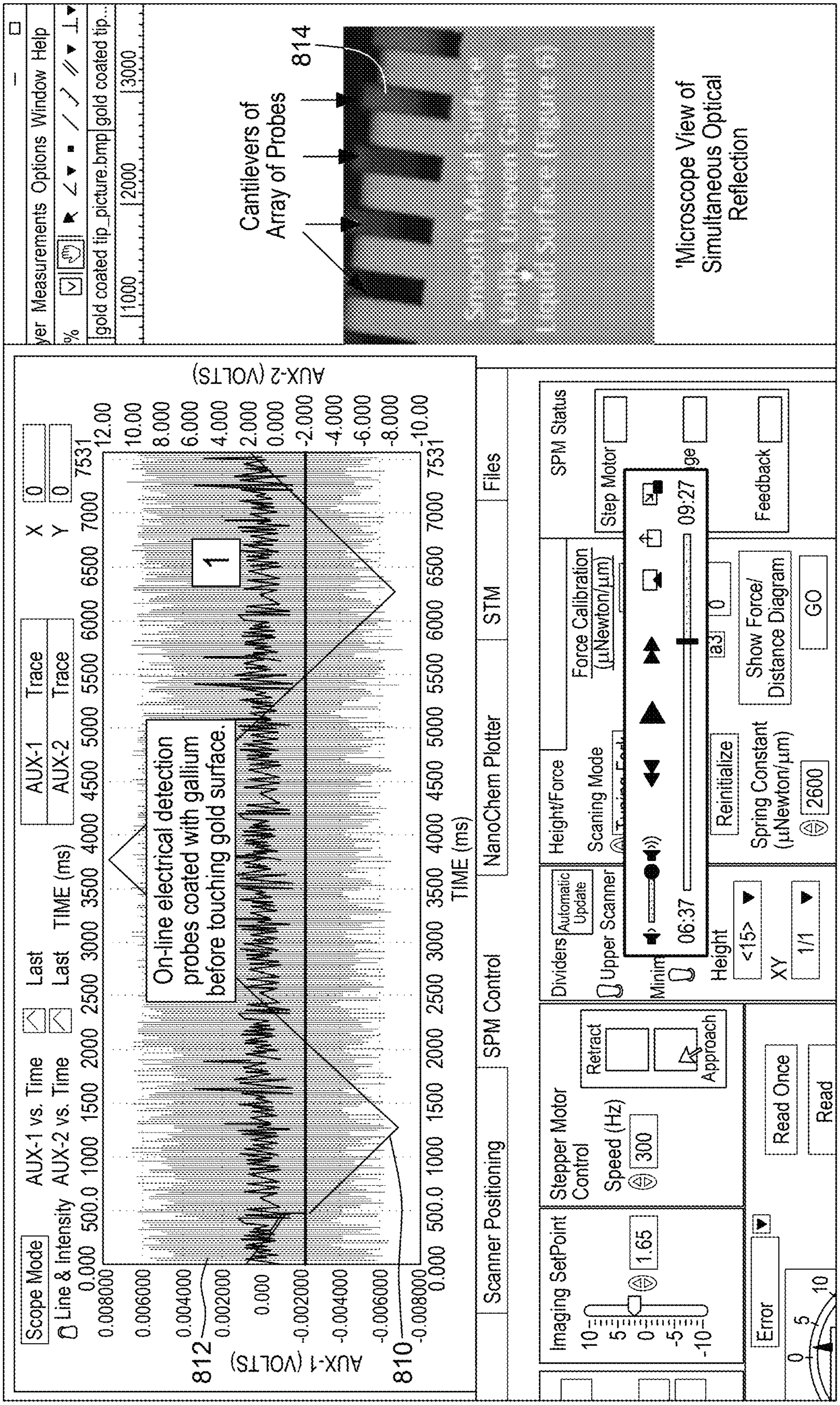
Figure 8C:
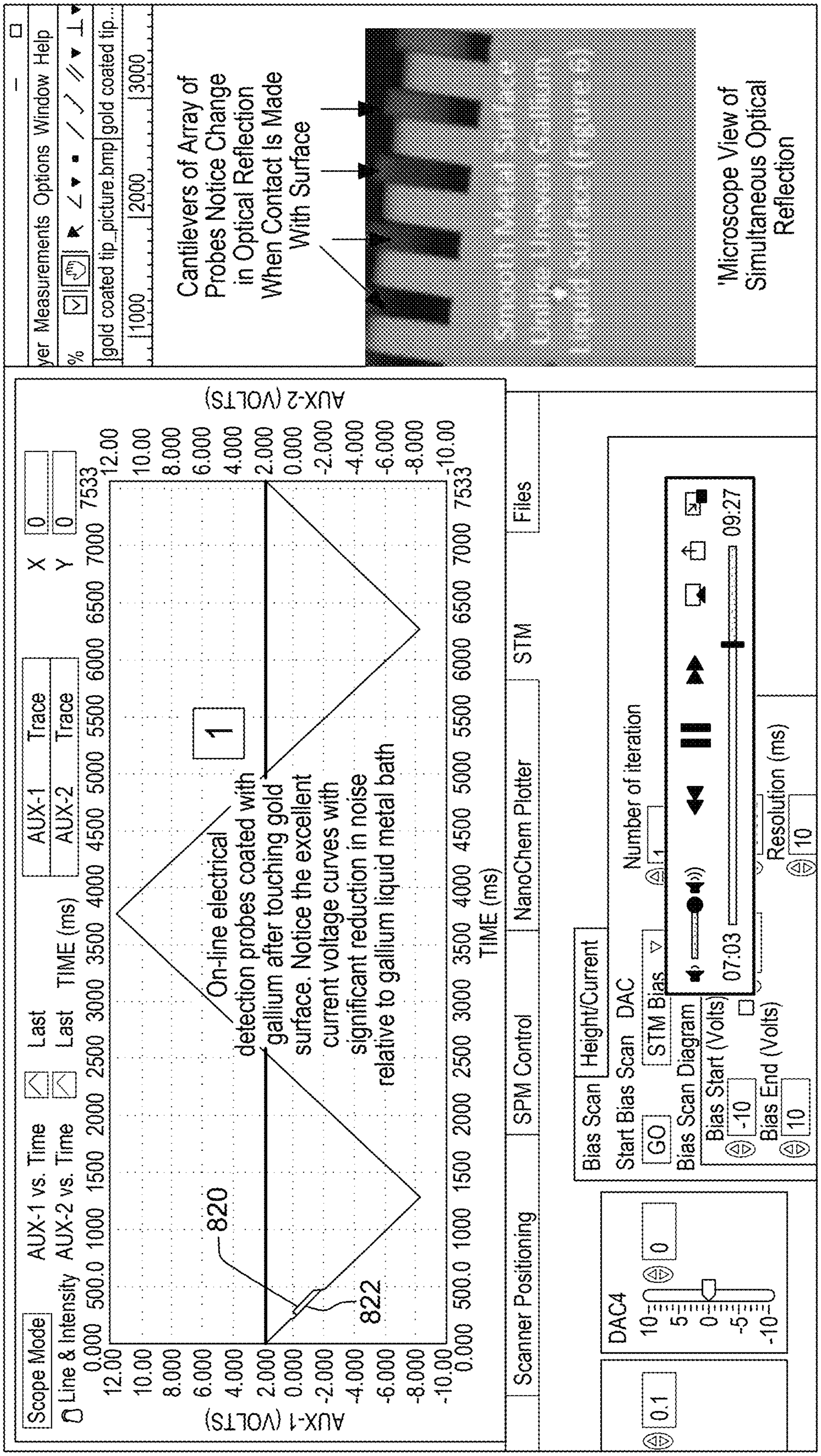

Conductivity is monitored in one example via the schematic of FIG. 7. The signal 804 obtained is indicated in FIG. 8A as an electrical conductivity as a function of time while the probe 806 is in the conductive metal liquid 808. This characterizes the electrical properties of the probe/probe tips in contact with the conductive material, be it a direct contact with the DUT or a contact with the DUT through a liquid metal bridge (e.g. liquid conductive material droplet) or even directly in the liquid metal. It is seen that the current indicated by 804 follows significantly closely the applied voltage 804, meaning the signal is good. It is noted that, as discussed above, probe geometry can vary, and, in some embodiments, each probe can have an end/tip that is substantially flat/straight as depicted in FIGS. 8A-8C, in contrast to a probe tip that narrows, for instance narrows to a point, as is depicted in other examples discussed herein.

When the probe tip is dipped in the liquid conductive material, the interaction between the tip and the material can be monitored and verified by (i) observing a change in reflected light as shown in FIGS. 5A-5B, (ii) monitoring for and observing a voltage change, (iii) or a combination of the two.

In each of the above cases (the probe touching the bath or contact pad), sustaining such contact may be independent and regardless of, and without requiring, any feedback. The approach in the case of FIG. 8A was effected by a stepper motor while monitoring with a charge-coupled device (CCD), although the use of the CCD is not essential for optical monitoring and in terms of the approach other automatic or manual approaches may be suitable. A good monitor of contact may be current measurement as shown. In an array of probes, and in situations where mainly optical/mechanical schemes were used to measure contact and the leveling of the array, in accordance with aspects described herein electrical signals may additionally or alternatively be used. The application of conductivity without the need for feedback, and with or without liquid metal droplets, simplifies the important operation of 'leveling' the probes relative to the contacts of the DUT. In this regard, currently applied leveling techniques without considering conductivity signals require relatively accurate leveling of the probes to the DUT. However, a by-product of making the probes readily capable of making electrical contact (via vacuum coating techniques and/or by the dipping of the probes into liquid conductive material as examples) is that the electrically conductivity observed can be used to readily 'level' the probes relative to the DUT surface(s) with which they are to make contact. By 'leveling' in this context is meant that each of the probes are aligned with/to a respective one or more contact pad(s) and is brought into appropriate electrical communication with those contact pad(s). And, electrical conduction can be used to tell which probes make electrical contact with their respective contact pads, and therefore how to move or tilt the array of probes and/or DUT to 'level' them relative to the DUT. Meanwhile, the droplet approach enables more readily electrical contact, with more tolerance for probes of different length due to greater leeway in electrical coupling between the droplet and the target conductive pad, for instance, since the droplets have a thickness that provides a buffer/leeway/tolerance in terms of probe tips being out-of-alignment and/or spaced from the contact pads but nonetheless the probes still each making appropriate electrical contact with the respective contact pads.

Flexibility requirements or characteristics of the cantilever probe, regardless whether active feedback is used, can be relaxed when a liquid metal bridge (droplet) is used. For instance, flexibility in the probe may not be as important because the probe itself need not necessarily physically touch any contact pad as contact of the liquid conductive bag is what provides the necessary electrical contact. Depending on the size of the bag, there may be a large enough buffer created that no probe tip need touch any conductive pad.

Moreover, in applications of probes to surfaces including those for scanned probe conductivity, thermal conductivity, thermocouple imaging, or other applications where electrical connection is needed, such liquid metal bridges allow for simplification of both electrical excitation and the measurement of electrical, thermal, conductivity and imaging. These and other electrical-based phenomena would be materially simplified as a result of features that result from such liquid metal bridges. Among features are excellence and effectiveness in the necessary electrical contact, the protection of the liquid metal and the inserted probe in this liquid inside the thin bag resulting from oxidation, and protection of the metal of the probe tip from oxidation. These and other features resolve many issues of scanned probe imaging based on electrical interactions even with a single probe, in addition to a probe array.

FIG. 8B depicts an example current voltage curve and optical properties of probes when coated with gallium and while the probes remain in air prior to introducing them to a gold surface (e.g. representative of having dipped the probes into, and then withdrawing them from, liquid metal and prior to the probes touching the contact points of the DUT). Plot 810 represents an applied voltage and plot 812 represents the excitation response (current) that is measured with a probe tip. The excitation response 812 is essentially just electrical noise. Meanwhile, the probes 814 appear relatively dark. This is contrasted with when the probe tips 814 are brought into contact with (in this case) a uniform, relatively smooth conductive surface of gold as in FIG. 8C. In FIG. 8C, plot 820 is applied voltage and plot 822 is current. There is obvious, near perfect, correlation between the two in FIG. 8C. Additionally, the optical indication on the right side of the figure shows that the probes appear much lighter when compared to FIG. 8B, illustrating that in addition to the electrical indication of the contact (via the waveform) there is a visual (optical) indication of contact. In this example, each probe has made electrical contact with the metal surface. Although the gallium example of FIG. 8A has more noise in the excitation signal, the comparison by way of FIG. 8C shows the excellent conductivity characteristics of the liquid metal relative to the excellent conductivity of gold.

In embodiments involving an array of probes, a respective electrical indication (e.g. plot) can be obtained for each probe of the array to individually assess the status of electrical coupling of the probe to a surface (such as the liquid conductive material or a contact pad) at that point in time.

Figure 9C:
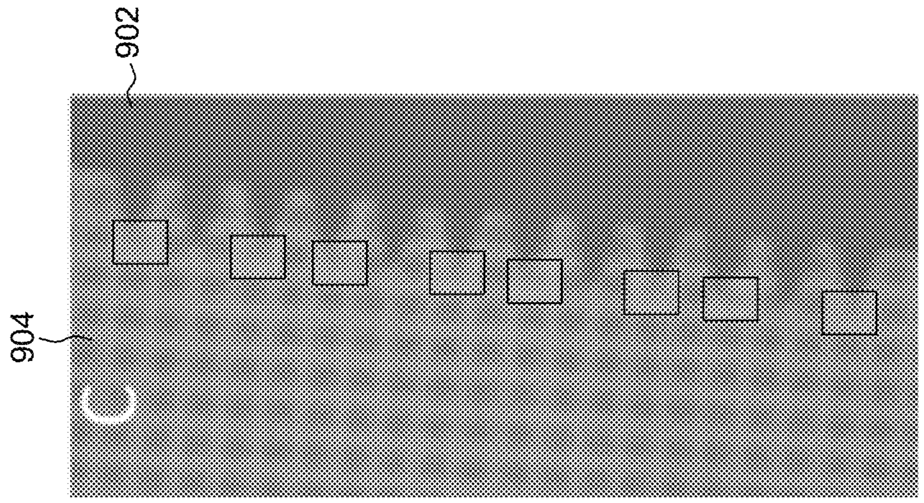
FIGS. 9A-9C depict examples of electrical-based leveling of an array of probes, in accordance with aspects described herein.
Figure 9B:
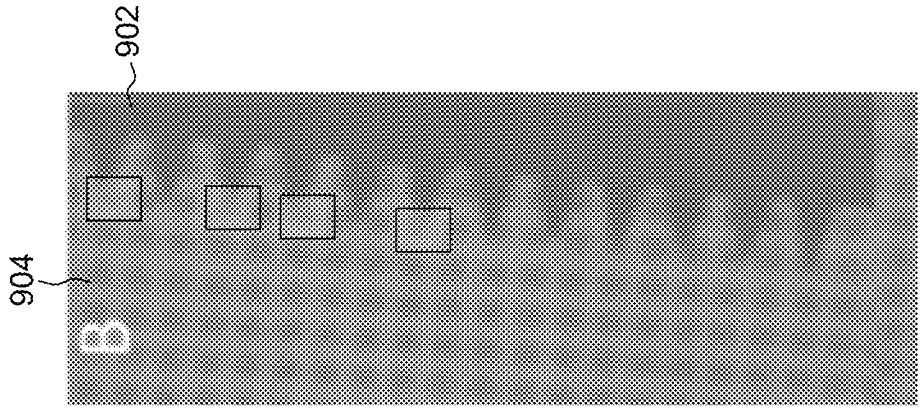
Figure 9A:
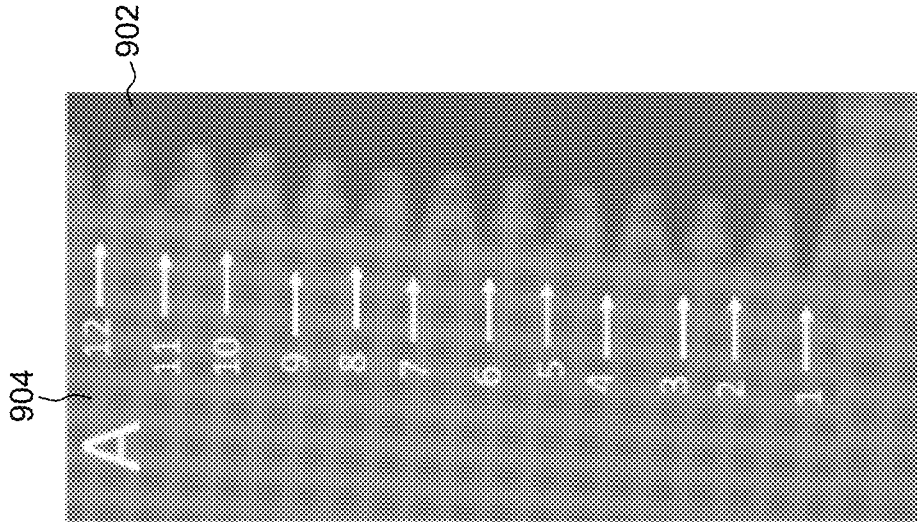

FIGS. 9A-9C depict examples of electrical-based leveling of an array of probes, in accordance with aspects described herein. In FIGS. 9A-9C, a linear array 902 of probes is provided over a DUT 904 that includes a plurality of devices to test. One objective may be to level the probes for roughly even contact with a corresponding set of the plurality of devices. This occurs in these examples in a two-step operation. Each probe may be monitored (for instance as shown in FIGS. 8A-8C) so that electrical properties of the probe at any given time can inform whether electrical contact between the probe and a corresponding device of the DUT has been made.

The pitch of the probe array (spacing between the adjacent probes) in this example does not exactly match the pitch of the optoelectronic array of devices (e.g. microLEDs), i.e. the spacing between adjacent devices. Thus, probes 11, 8, 5 and 2 do not make contact in any of FIG. 9A-9C with any of the contact points. Initially, in FIG. 9A, there is no contact between any probe of the array 902 and the DUT 904. In FIG. 9B, probes 12, 10, 9, and 7 (most of an upper portion of the probe array) have come into contact with respective contact points, as evidenced by the emissions (blue luminescence) from a corresponding 4 microLEDs. Then in FIG. 9C, probes 6, 4, 3, and 1 have additionally made contact with respective contact points of the DUT to illuminate another 4 microLEDs of the DUT. FIGS. 9A-9C are just for illustrative purposes, and in practical applications the pitch of the probe array may be in greater alignment with the pitch of the contact points of the DUT, even if testing is conducted in multiple sweeps.

Figure 10C:
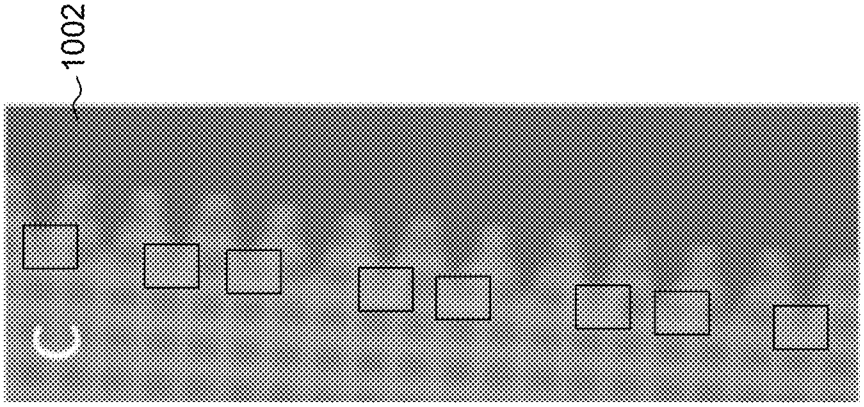
FIGS. 10A-10C illustrate consecutive excitations when testing a DUT, in accordance with aspects described herein.
Figure 10B:
Figure 10A:
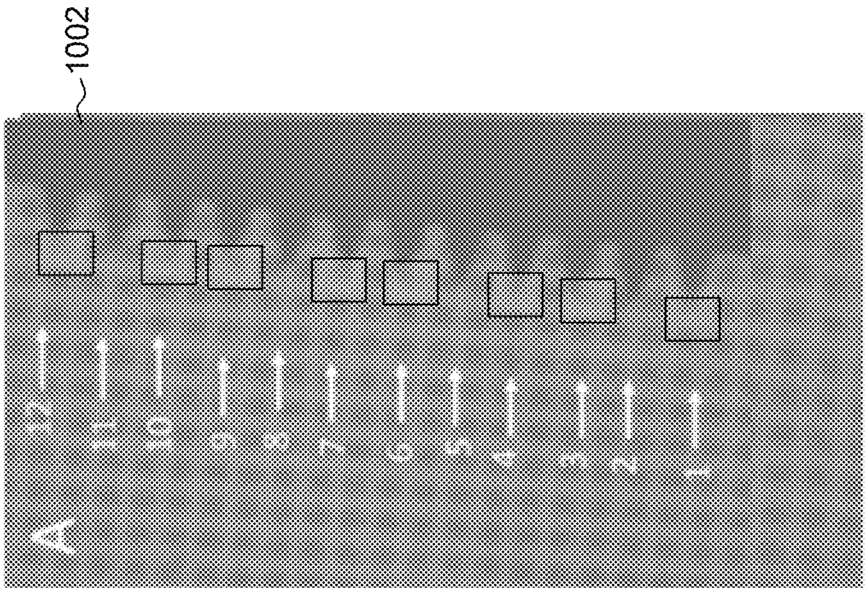

FIGS. 10A-10C illustrate consecutive excitations when testing a DUT, in accordance with aspects described herein. In testing a DUT having hundreds, thousands, or millions of individual devices for testing, repeatability may be very important for efficient testing. In FIG. 10A, the probes of the probe array 1002 (numbered 1 through 12) are each in contact with a respective contact pad of a first set of contact pads of the DUT corresponding to 8 microLEDs that are lit (indicated by the 8 boxes). In FIG. 10B, the probes of the array 1002 have been lifted out of contact with the first set of contact pads. In FIG. 10C, the probes of the array 1002 have been brought into contact with a second set of contact pads of the DUT corresponding to another 8 microLEDs that are lit (again indicated by the 8 boxes). In some embodiments, the probes were dipped in liquid conductive metal prior to electrically coupling to the first set of contact pads (FIG. 10A), then the probes were lifted or in another way moved from the first set of contact pads as shown in FIG. 10B, optionally dipped again in the liquid conductive material, and were then electrically introduced to a second set of contact pads as in FIG. 10C.

In one or some embodiments of aspects described herein, a tool and method of using the tool is provided. The tool may be designed to hold a probe tip, or plurality of probe tips optionally in parallel to each other, and to allow for flexible contact of the probe tip(s) with a device of interest (e.g. DUT). The probe tips can have a geometry consistent with electrical and/or optical and/or mechanical capabilities and/or chemical characteristics of elements of device of interest such that the probe tips can excite such elements of the device of interest for a duration of time (such as 1 second or less, as an example) and with or without active feedback. This may be achieved while preventing, minimizing, or eliminating any risk of contact damage to the probe tip(s) and/or damage to the device of interest, and further, optionally, being configured to enable/allow for optical viewing and other means of monitoring the effect of the excitation by the probe tip(s).

Optionally, the tool may be constructed using silicon micro/nanofabrication technology. For instance, an array/matrix of probe(s) with the probe tip(s) can be manufactured at least in part using such fabrication technology. In examples, a photoresist is used in patterning features on a substrate for etching and deposition of conductive elements and other features to form an integrated circuit or other electrical device.

Optionally the tool may be fabricated from polymer materials and/or materials other than pure or doped silicon, such as silicon nitride or other materials with characteristics that facilitate effective fabrication of desired geometries.

Optionally the tool allows for multiple excitation and detection paths to be implemented at the same time. Optionally the signals detected by contact of the probe tip(s) to the DUT are used in leveling the carrier of the probe tip(s) relative to the DUT so that a plurality (for instance all) of the probes of the tool are in appropriate contact with features of the DUT. This can allow for leveling by some signal such as optical reflection from surface(s) of the tool, for instance surface(s) of probe(s) of the tool. In some examples leveling can be achieved without measuring an electrical property (such as current) at probe tip(s), those this and other means of detecting leveling of the tool relative to the DUT are not excluded.

Optionally the probe tip(s) can be inserted into a conductive material, such as one in liquid form, to coat at least a portion of the probe(s), for instance some or all of the probe tip portion(s) of the probe(s) to form a droplet thereon. This allows for the transfer of the liquid conductive material, in the form of droplet(s) on the probe tip(s), from a bath of liquid conductive material to the DUT without loss of the liquid of those droplets on the probe tip(s). Optionally this also enables transfer/repositioning/relative movement between the probe tip(s) and the DUT, while the liquid conductive material remains, from one or more elements of the device (such as a set of contact pad(s)) to another set of elements of the device (such as another set of contact pad(s)) without the need, if so desired, for repeated dipping of the probe tip(s) in the liquid conductive material. In examples the liquid conductive material is or comprises a liquid metal.

The probe(s) may be conductive probe(s) and there may be an electrically-conductive bridge, provided for instance by the droplet, between each probe tip and a contact on the DUT such that the probe tip need not have direct physical contact with the DUT. For instance, the probe tip may be spaced from the contact of the DUT, with conductive material (that adheres to the probe tip) filling the space between the probe tip and the contact of the DUT and providing electrical coupling of the probe tip to the contact of the DUT. Optionally the conductive material to coat the probe tip may be readily cleaned from the probe tip and the DUT. The introduction of the liquid conductive material to the probe tip and to the contact of the DUT can be temporary for purposes of exciting element(s) (such as microLEDs) of the DUT, i.e. to test/inspect these elements of the DUT for desired functioning. After testing/excitation, the DUT may be moved away from the probes, cleaned of the liquid conductive material to the extent necessary, and then put into production or used in the manufacture/fabrication of other devices, as examples.

Some features of aspects described herein are as follows, may be implemented alone and/or in combination with each other. In embodiments, a method may be provided for testing a device under test (DUT), the method using a test tool comprising a plurality of electrically-conductive test probes, the DUT comprising a plurality of contact points associated with a plurality of individual devices, of the DUT, to be electrically excited. The method can include positioning the plurality of test probes relative to the plurality of contact points such that the plurality of test probes come into electrical contact with the DUT at the plurality of contact points, driving, by way of one or more electrical signals delivered via the plurality of test probes to the plurality of contact points, parallel electrical excitation of the plurality of individual devices, and maintaining the electrical contact between the plurality of test probes and the plurality of contact points continuously while performing the driving of the parallel excitation. The driving and the maintaining may be performed absent/without using active feedback to maintain the electrical contact between the plurality of test probes and the plurality of contact points continuously while performing the driving the parallel electrical excitation.

In any of the foregoing, and/or alternative embodiments, the method further includes observing, as part of the positioning, reflective signals from the plurality of test probes and confirming, based on the observed reflective signals, that the electrical contact between the plurality of test probes and the plurality of contact points has been made, wherein the driving is performed responsive to (triggered based on) the confirming. In embodiments, the plurality of test probes are configured to be physically attracted to the plurality of contact points based on positioning the plurality of test probes proximate the plurality of contact points, where the reflective signals indicate forces exerted on the plurality of test probes, and where confirming is based on observing, based on the reflective signals, that the plurality of test probes have been physically attracted to the plurality of contact points to make the electrical contact there between.

In any of the foregoing, and/or alternative embodiments, the method further includes observing, as part of the positioning, luminescence from the plurality of individual devices and confirming, based on the luminescence, that the electrical contact between the plurality of test probes and the plurality of contact points has been made, wherein the driving is performed responsive to (triggered based on) the confirming.

In any of the foregoing, and/or alternative embodiments, the one or more electrical signals driving the parallel electrical excitation comprise a voltage or current applied in parallel to at least some of the plurality of contact points with a corresponding at least some of the plurality of test probes.

In any of the foregoing, and/or alternative embodiments, the plurality of individual devices comprise a plurality of micro light-emitting diode (microLED) devices.

In any of the foregoing, and/or alternative embodiments, the plurality of contact points are a first plurality of contact points of the DUT, the plurality of individual devices to be electrically excited are a first plurality of individual devices to be excited, and the method further comprises, after the driving the parallel electrical excitation withdrawing/moving the plurality of test probes from/relative to the plurality of contact points, then positioning the plurality of test probes relative to a next plurality of contact points of the DUT such that the plurality of test probes come into electrical contact with the DUT at the next plurality of contact points. In some examples, the movement is performed to move the test probes away from the plurality of contact points until contact is established with the next plurality of contact points. In any event, the method can further include driving, by way of one or more electrical signals delivered via the plurality of test probes to the next plurality of contact points, parallel electrical excitation of a next plurality of individual devices of the DUT. In embodiments, the method further includes repeating the withdrawing/moving, positioning, and driving for one or more iterations, such that multiple pluralities of individual devices of the DUT are electrically excited via multiple pluralities of contact points of the DUT.

In any of the foregoing, and/or alternative embodiments, the method can include submerging at least a portion of each test probe of the plurality of test probes in a liquid conductive material, and withdrawing/moving the submerged at least a portion of each test probe from the liquid conductive material, wherein, for each test probe of the plurality of test probes, a droplet of the liquid conductive material remains on an end of the test probe and in electrical contact with an electrically-conductive portion of the test probe, where the positioning is performed based on the submerging and the withdrawing, where the positioning the plurality of test probes positions the plurality of test probes such that, for each test probe of the plurality of test probes, the liquid conductive material on the end of the test probe makes physical contact with a respective contact point of the plurality of contact points, and the driving delivers an electrical signal via the test probe to the respective contact point through the liquid conductive material. In further embodiments, the plurality of contact points are a first plurality of contact points of the DUT, the plurality of individual devices to be electrically excited are a first plurality of individual devices to be excited, and wherein the method further comprises, after the driving the parallel electrical excitation, withdrawing/moving the plurality of test probes from/relative to the plurality of contact points, positioning the plurality of test probes relative to a next plurality of contact points of the DUT such that the plurality of test probes come into electrical contact with the DUT at the next plurality of contact points, and such that, for each test probe of the plurality of test probes, the liquid conductive material on the end of the test probe makes physical contact with a respective next contact point of the plurality of next contact points. In some examples, the movement is performed to move the test probes away from the plurality of contact points until contact is established with the next plurality of contact points. In any event, the method can further include driving, by way of one or more electrical signals delivered via the plurality of test probes to the next plurality of contact points, parallel electrical excitation of a next plurality of individual devices of the DUT. In further embodiment, the method further includes, prior to the positioning the plurality of test probes relative to the next plurality of contact points, repeating the submerging and the withdrawing from the liquid conductive material, then performing the positioning/moving of the plurality of test probes relative to the next plurality of contact points. In some examples, this is done while maintaining the quantity of conductive material on the end of the probe.

In any of the foregoing, and/or alternative embodiments, the plurality of test probes comprises an array of test probes with equidistant spacing between test probes of the array of test probes.

In any of the foregoing, and/or alternative embodiments, a reservoir comprising liquid conductive material provides liquid conductive material to ends of the plurality of test probes via one or more conduits/channels/passageways extending to the ends of the plurality of test probes. In further embodiments, a droplet of the liquid conductive material forms on the end of each test probe of the plurality of test probes probe, and where positioning the plurality of test probes positions the plurality of test probes such that, for each test probe of the plurality of test probes, the liquid conductive material on the end of the test probe makes physical contact with a respective contact point of the plurality of contact points, and the driving delivers an electrical signal via the test probe to the respective contact point through the liquid conductive material droplet on the end of the test probe.

In accordance with additional aspects, a method is provided for testing a device under test (DUT), the method using a test tool comprising an electrically-conductive test probe, the DUT comprising a contact points associated with an individual device, of the DUT, to be electrically excited, the method including positioning the test probe relative to the contact point such that the test probe comes into electrical contact with the DUT at the contact point, driving, by way of one or more electrical signals delivered via the test probe to the contact point, electrical excitation of the individual device, and maintaining the electrical contact between the test probe and the contact point continuously while performing the driving the electrical excitation, where the driving and the maintaining are performed absent/without using active feedback to maintain the electrical contact between the plurality of test probes and the plurality of contact points continuously while performing the driving the parallel excitation.

In accordance with further aspects, a method is provided for testing a device, the method including submerging at least a portion of an electrically-conductive test probe of a test device/tool in a liquid conductive material, withdrawing/moving the submerged at least a portion of the test probe from the liquid conductive material, wherein a droplet of the liquid conductive material remains on an end of the test probe and in electrical contact with an electrically-conductive portion of the test probe, positioning the test probe and a contact point of a device under test (DUT) relative to each other such that the liquid conductive material on the end of the test probe makes physical contact with the contact point on the DUT, and driving, by way of an electrical signal delivered via the test probe to the contact point through the droplet of liquid conductive material on the end of the test probe, an excitation of a device of the DUT. In embodiments, the positioning positions the end of the test probe and the contact point relative to each other such that the end of the test probe and the contact point are physically spaced-apart, where the droplet of liquid conductive material occupies at least a space between a probe tip of the test probe and the contact point, and electrically bridges the electrically-conductive portion of the test probe and the contact point. In such embodiments, the device of the DUT can include a micro light-emitting diode (microLED).

In any of the foregoing, and/or alternative embodiments, the liquid conductive material comprises metal. The could include, for instance, gallium.

In any of the foregoing, and/or alternative embodiments, the submerged at least a portion of the test probe includes at least a portion of a probe tip of the test probe.

In any of the foregoing, and/or alternative embodiments, the contact point is a first contact point, and the method further includes after the driving the excitation, withdrawing/moving the test probe from/relative to the first contact point, wherein at least a portion of the droplet of liquid conductive material remains as a droplet on the end of the test probe after the withdrawing/moving and remains in electrical contact with the electrically-conductive portion of the test probe, positioning the test probe and a next contact point of the DUT relative to each other such that the remaining droplet of liquid conductive material on the end of the test probe makes physical contact with the next contact point of the DUT, and driving, by way of an electrical signal delivered via the test probe to the next contact point through the droplet of liquid conductive material on the end of the test probe, an excitation of a next device of the DUT. In some examples, the movement is performed to move the test probe away from the contact point until contact is established with the next contact point.

In any of the foregoing, and/or alternative embodiments, the method iterates, one or more times, the withdrawing/moving, the positioning the test probe and a next contact point relative to each other, and the driving the excitation of the next device, where at each iteration of the iterating the next contact point is a next selected contact point corresponding to a next device of the DUT.

In any of the foregoing, and/or alternative embodiments, a method further includes measuring signal(s), such as electroluminescence, mechanical deformation, chemical initiation, and/or electrical excitation of the device based on the driving the excitation.

In any of the foregoing, and/or alternative embodiments, the positioning moves the test probe, the DUT, or both in order to position the test probe and the contact point closer to each other.

In any of the foregoing, and/or alternative embodiments, a method further includes monitoring an electrical signal from the test probe and determining, based on the monitored electrical signal, whether electrical contact with the contact point has been made.

In any of the foregoing, and/or alternative embodiments, the test probe is one test probe of an array or plurality of test probes of the test device, and wherein the submerging, withdrawing, positioning, and driving is performed with each test probe of the array/plurality of test probes to electrically couple each test probe with a respective contact point of the DUT and drive an excitation of a respective device of the DUT. In embodiments, the further includes leveling the array/plurality of test probes relative to a plurality of devices of the DUT and/or aligning the array/plurality of test probes with the plurality of devices of the DUT, wherein the leveling/aligning comprises monitoring electrical signals from the test probes of the array/plurality of test probes and determining, based on the monitored electrical signals, whether the array/plurality of test probes is leveled with respect to and/or aligned with the plurality of devices of the DUT. Further, in embodiments the method senses, e.g., in the form of optical-based recognition, indicative of sustained contact of the test probes, of the array/plurality of test probes, with the DUT, is not required and/or is not monitored. In embodiments, active feedback including automatic movement/physical adjustment of at least one of the array/plurality of test probes and the DUT to sustain contact of the test probes, of the array/plurality of test probes, with the DUT, is not required and/or undertaken.

In any of the foregoing, and/or alternative embodiments, a test probe is manufactured to be inflexible and/or with a flexibility defined by a selected force constant, the selected force constant optionally being selected from, or to be within, a desired range of values, and/or below a threshold, an example threshold being 5 Newton-meters.

In additional embodiments, a method of preparing a test probe for electrical excitation of a device under test is provided. The preparing includes submerging at least a portion of the test probe in a liquid conductive material, and withdrawing/moving the submerged at least a portion of the test probe from/relative to the liquid conductive material, where a droplet of the liquid conductive material remains on an end of the test probe and in electrical contact with an electrically-conductive portion of the test probe, where the liquid conductive material remains at least partially in liquid physical form, or as a malleable solid, during the electrical excitation of the device under test.

In yet additional embodiments, a method of testing a device under test (DUT) is provided that includes submerging at least a portion of a test probe in a liquid conductive material, withdrawing/moving the submerged at least a portion of the test probe from/relative to the liquid conductive material, where a droplet of the liquid conductive material remains on an end of the test probe and in electrical contact with an electrically-conductive portion of the test probe, and introducing the droplet of the liquid conductive material on the end of the test probe to a contact point of the DUT, where the test probe and the contact point remain physically spaced-apart with the liquid conductive material disposed therebetween during electrical excitation of a device, of the DUT, associated with the contact point.

In accordance with further embodiment, a system for testing a device under test (DUT) is provided, the system including an array/plurality of test probes and a liquid conductive material. In embodiments, each test probe of the array/plurality of test probes is manufactured to be inflexible and/or with a flexibility defined by a selected force constant, the selected force constant optionally being selected from, or to be within, a desired range of values, and/or below a threshold, an example threshold being 5 Newton-meters. Additionally, in some embodiments, a method of using the system includes dipping/submerging at least a portion of each test probe of the array/plurality of test probes in the liquid conductive material, withdrawing/moving the submerged at least a portion of each test probe from/relative to the liquid conductive material, where, for each test probe of the array/plurality test probes, liquid conductive material remains on an end of the test probe and in electrical contact with an electrically-conductive portion of the test probe, and moving the array of test probes and/or the DUT toward/relative to each other such that the liquid conductive material on the ends of the test probes makes physical contact with respective contact points on the DUT while the liquid conductive material remains at least partially in liquid state.

Aspects discussed herein, particularly probe arrays, may relate to probe card technology that provides a collection of probes as a ‘card’ for testing devices. In some embodiments, an array of probes as discussed herein may be provided on/as part of a probe card. Probe cards typically sit underneath complex circuitry and connect to that complex circuitry to push/impose voltages through it for testing purposes. The probes of a probe card can protrude upward from a substrate material of the card. The protrusions can be flexible to some extent and some probes may be greater in length than other probes. Flexibility can enable the longest protrusions to flex/bend after making physical contact with the DUT until the shorter protrusions make physical contact with the DUT. A consideration here is avoid damaging to the probe structure. Protrusion bending can result in imprecise, non-uniform, physical touching of the probes/tips with the respective contacts through which the individual elements/devices under test are to be excited and measured. This may be especially problematic where uniform device excitation is required in a variety of applications from display testing to testing of parallel electromotion of multiple devices. An approach to overcome issues related to imprecise, non-uniform contact in fabricated arrays of probes is provision of a flexible sample surface, such as a polymer film. Another example of a fabricated array of probes where the sample is flexible is used in a technique referred to as beam pen nanolithography. Other lithographic applications involve externally coating probes with non-conductive liquid inks. However, there is no discussion of applying liquid, highly conducting materials to achieve repeated, soft electrical interactions of probe tips with device(s) under test. Such coatings would not allow for parallel electrical excitation of devices under test as discussed herein, let alone repeated electrical coupling and excitation by a same probe/probe tip on successive contacts.

While probe tips can themselves, separate from any dipping discussed herein, be coated with a hard metal coating, the objective of such a coating was conventionally not to facilitate electrical contact with a surface but instead was undertaken to provide an opaque coating around the probe tip in order to facilitate the propagation of light in a confined space, and close to the sample in the near field.

Meanwhile, some approaches involving the use of feedback see probes emanating from a flexible polymer film on a hard sapphire backing. A complex method of feedback can be implemented in these situations in which optical reflection and imaging multiple points in parallel with force microscopy can inform feedback movements. One goal was to apply the softest touch possible to measure forces for imaging, rather than to, for instance, make appropriate electrical contact with a surface while achieving the same electrical excitation conditions for the devices to be excited in a flexible, equivalent and repeatable manner and without feedback.

In another approach for parallel feedback, an array of probes are conducting and emanate from a flexible polymer and do not touch in parallel but alternately touch as the sample is scanned under the probe array. The electrical signals obtained in response change with time as the sample scans, thus forming a time-altering picture of the feedback for imaging. However, this is not effective for goals of embodiments herein, for instance achieving parallel excitation in a repeatable manner.

In yet further approaches, a massively parallel array of silicon probes is provided with a reservoir for delivering non-conducting inks, in which the inks are provided from the reservoir through a channel delivering the liquid to a canonical tip rather than being applied by way of submersion/dipping from the outside of the probe. Further, the liquid inks were used in applications pertaining to lithography rather than device testing since the inks were non-conductive as noted above.

Some probe designs can incorporate ‘hollow’ glass probes. An array of hollow glass tubes has been proposed for fountain-pen style nanolithography for example. One approach could coat hollow probes and fill them with conductive material(s) to permit effective electrical conductivity. However, it may be difficult to fill such tubes with conductive material, such as liquid metal, due to wettability of the surface of the hollow probe by the liquid metal. Chemical modification of such hollow probes or the use of wetting agents might overcome this problem when using parallel hollow-probe silicon or similar microfabrication technology.

Probes that have been used in conjunction with gallium have been hollow glass probes to contain the liquid metal and such hollow probes with gallium have exclusively been applied for lithography. Related to this, there are known ways to pressurize gallium into glass pipettes for writing applications. However, both the application of lithography and the use of glass probes does not disclose massive arrays of probes either for lithography or more important electrical excitation and viewing of devices.

Furthermore, conventional approaches utilizing some of the above have not provided associated technology to efficiently and effectively level all of the probes in the array on their respective corresponding contact surfaces. Approaches for leveling focus on assemblies of flexible joints with support structures to bring the array of probes to a surface and level them. However, in accordance with aspects described herein, the leeway provided by a conductive droplet in terms of acceptable distance between the probe tip and contact surface for electrical conductivity, together with conductivity of the droplet material, enable leveling based on monitored surface conductivity, if desired. Additionally or alternatively, reflection-based leveling may be provided.

While mechanical leveling could be used in conjunction with aspects described herein, it is not required. The non-conductive nature of ink that may externally coat probes in line with past approaches utilizing coated probes does not enable the foregoing; electrical interaction with the surface via conductivity of the probe tip and the surface has not been used to verify leveling, and other methods (such as active feedback) was used to verify leveling independent of probe tip surface electrical interaction. Nonetheless, it is noted that such other methods may be applicable and used in conjunction with aspects described herein.

Accordingly, no prior approaches combine parallel approaches of arrays of probes to achieve excellent, similar, and repeatable electrical interactions in parallel to effectively excite arrays of devices for test/inspection applications, for instance to inspect microLEDs in a display to achieve electroluminescence-based defect inspection.

Aspects described herein can reduce the inspection time of wafer(s) to be inspected. The reduced inspection time can enable test tools/probe arrays as described herein to be introduced into production/practical applications. As an example, consider a 6 inch wafer of microLEDs where pitch between contacts is 64.8 microns and the wafer has approximately 4.2 million microLEDs thereon. Assume also a probe card with an array of 45×45 probes (i.e. 2025 probes) for driving voltage/current, and relative to a common ground, and therefore about 2074 measurements are needed to inspect the microLEDs of the full wafer (4.2 million microLEDs/2025 probes=approximately 2074 measurements to check the approximately 4.2 million microLEDs thereof). If each measurement (involving 2025 probes testing 2025 microLEDs) takes 1 second, then approximately 2074 seconds (0.6 hours) are needed to inspect the microLEDs of wafer. In a single-probe scenario to probe each microLED, 4.2 million seconds (about 1.6 months) would be needed (by way of example only, and not limitation).

Figure 12:
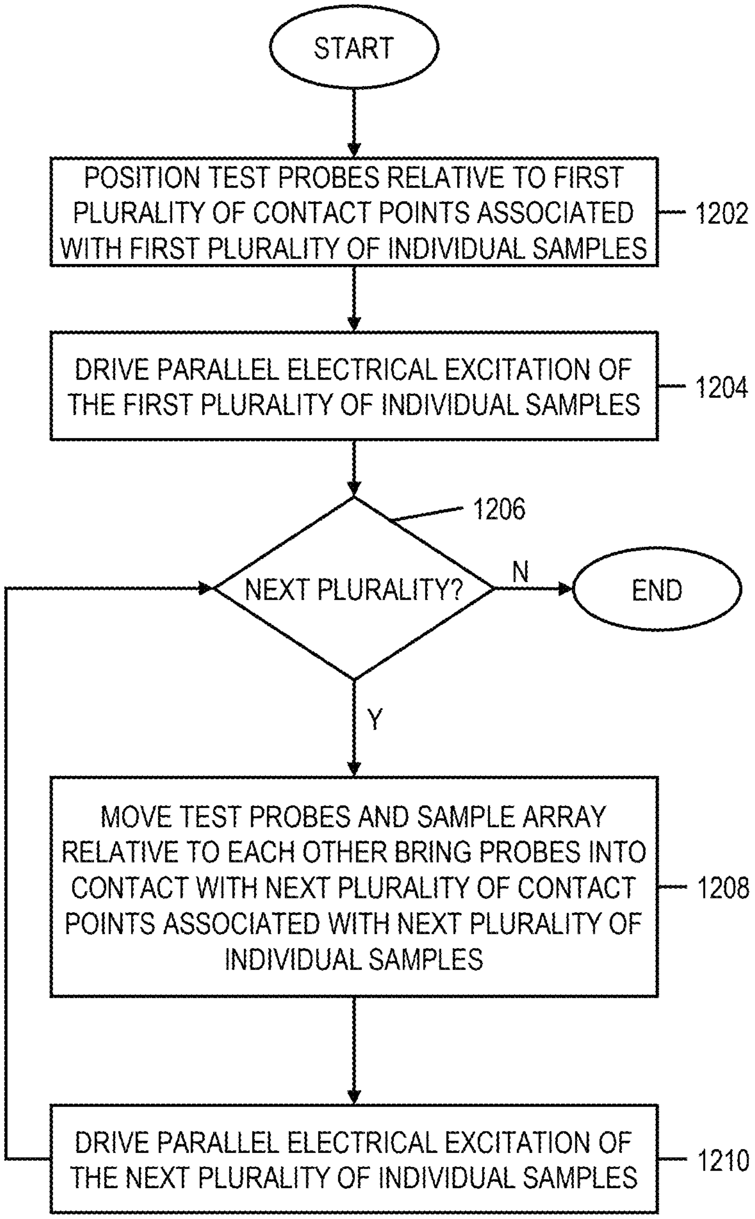
FIGS. 12-13 depict examples processes for testing sample(s) in accordance with aspects described herein.

Devices and related methods/processes have been described herein. FIG. 12 depicts an example process for testing a sample array comprising individual samples in accordance with aspects described herein. The method uses a test tool that includes comprising a plurality of electrically-conductive test probes. The process may be executed, in one or more examples, by a processor or processing circuitry of one or more computers/computer systems, such as those described herein, for instance a computer system of, or in communication with, the test tool.

The process of FIG. 12 includes positioning (1202) the plurality of test probes relative to a first plurality of contact points of the sample array, the first plurality of contact points being associated with a first plurality of individual samples of the sample array, such that the plurality of test probes come into electrical contact with the sample array at the first plurality of contact points. The process drives (1204) driving, by way of one or more electrical signals delivered via the plurality of test probes to the first plurality of contact points, parallel electrical excitation of the first plurality of individual samples, where electrical contact between the plurality of test probes and the first plurality of contact points is maintained continuously while performing the driving the parallel excitation of the first plurality of individual samples The parallel excitation of the first plurality of individual samples produces first values for testing the first plurality of individual samples. The process determines (1206) whether there is/are any next plurality of individual samples to test. If not (1206, N), the process ends. Otherwise (1206, Y), the process moves (1208) the plurality of test probes relative to the sample array by moving at least one of the plurality of test probes and the sample array, such that, based on the moving, the plurality of test probes are positioned relative to a next plurality of contact points such that the plurality of test probes come into electrical contact with the next plurality of contact points, the next plurality of contact points associated with a next plurality of individual samples of the sample array. The process additionally drives (1210), by way of one or more electrical signals delivered via the plurality of test probes to the next plurality of contact points, parallel electrical excitation of the next plurality of individual samples, where electrical contact between the plurality of test probes and the next plurality of contact points is maintained continuously while performing the driving the parallel excitation of the next plurality of individual samples. The parallel excitation of the next plurality of individual samples produces second values for testing the next plurality of individual samples. After driving the excitation of the next plurality of samples, the process can return to 1206 to either end or continue to a next set of samples.

In embodiments, the individual samples are micro light-emitting diode (microLED) devices.

In some embodiments, driving the parallel electrical excitation of the first plurality of individual samples is performed absent use of active feedback to continuously maintain the electrical contact between the plurality of test probes and the first plurality of first contact points while performing the driving the parallel electrical excitation of the first plurality of individual samples. This may be true for any other individual samples tested.

In embodiments, the process further includes observing, based on interaction of the plurality of test probes with the first plurality of contact points, luminescence from the first plurality of individual samples and confirming, based on the luminescence, that the electrical contact between the plurality of test probes and the first plurality of contact points has been made, and the driving is performed responsive to (i.e., may be triggered based on or by) the confirming.

In embodiments, the process further includes observing, as part of the positioning the plurality of test probes relative to the first plurality of contact points, reflective signals from the plurality of test probes and confirming, based on the observed reflective signals, that the electrical contact between the plurality of test probes and the first plurality of contact points has been made, wherein the driving the parallel electrical excitation of the first plurality of individual samples is performed responsive to (i.e., may be triggered based on or by) the confirming.

In embodiments, at least a portion of each test probe of the plurality of test probes is made of translucent material.

In embodiments, the plurality of test probes comprises an array of test probes with equidistant spacing between test probes of the array of test probes.

Figure 13:
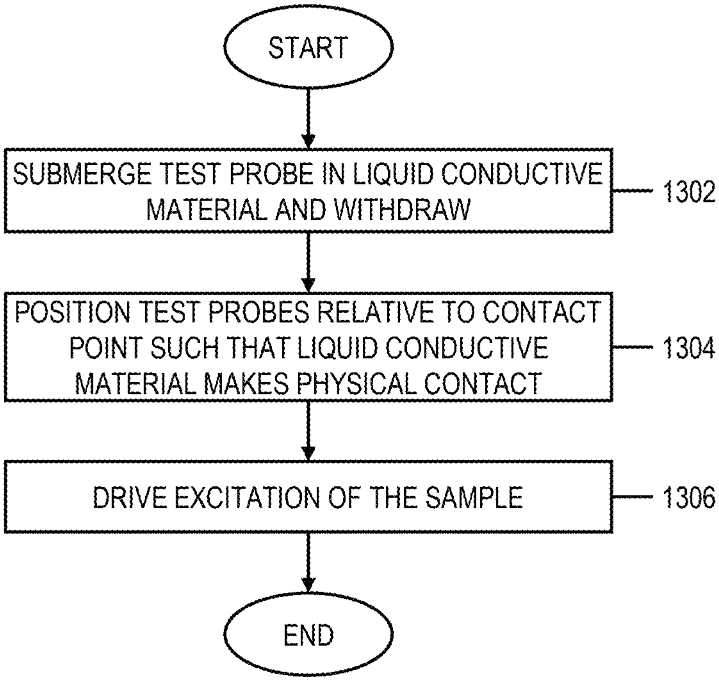

FIG. 13 depicts another example process, in this case a process for testing a sample. The process may be executed, in one or more examples, by a processor or processing circuitry of one or more computers/computer systems, such as those described herein, for instance a computer system of, or in communication with, a test tool.

As 1302, the process submerges at least a portion of an electrically-conductive test probe of a test device in a liquid conductive material and withdraws the submerged at least a portion of the test probe from the liquid conductive material, where, based on this, a portion of the liquid conductive material remains on an end of the test probe and in electrical contact with an electrically-conductive portion of the test probe. The process positions (1304) the test probe relative to a contact point of the sample such that the portion of liquid conductive material on the end of the test probe makes physical contact with the contact point of the sample, and drives (1306), by way of an electrical signal delivered via the test probe to the contact point through the portion of liquid conductive material on the end of the test probe, an excitation of the sample.

In embodiments, the positioning positions the end of the test probe relative to the contact point such that the end of the test probe and the contact point are physically spaced-apart, where the portion of liquid conductive material occupies at least a space between the end of the test probe and the contact point, and electrically bridges the electrically-conductive portion of the test probe and the contact point.

In embodiments, the sample is a micro light-emitting diode (microLED) device.

In embodiments, the liquid conductive material is metallic. In some such embodiments, the liquid conductive material comprises gallium.

In embodiments, the process further includes monitoring an electrical signal from the test probe and determining, based on the monitored electrical signal, whether electrical contact with the contact point has been made.

In embodiments, the test probe is one test probe of a plurality of test probes of the test device, where the sample is one of an array of samples, and where the submerging, withdrawing, positioning, and driving is performed with each test probe of the plurality of test probes to electrically couple each test probe with a respective contact point of a respective sample of the array of samples and drive an excitation of the respective sample.

In some examples, methods or aspects thereof may be performed by one or more computer systems, for examples computer system(s) that control a device/tool comprising an array of probes. The control can control movement of the tool, the DUT, and/or components of each, for instance. The computer system(s) could be incorporated with/provided as part of the tool or could communicate with the tool over one or more communications links, which may be any wired or wireless communication links configured for digital/data communications. In some examples, the computer system(s) may be remote from the tool. Thus, processes described herein may be performed singly or collectively by one or more computer systems. A computer system may also be referred to as a data processing device/system, computing device/system/node, or simply a computer. The computer system may be based on one or more of various system architectures and/or instruction set architectures, such as those offered by Intel Corporation (Santa Clara, California, USA) or ARM Holdings plc (Cambridge, England, United Kingdom), as examples.

Figure 14:
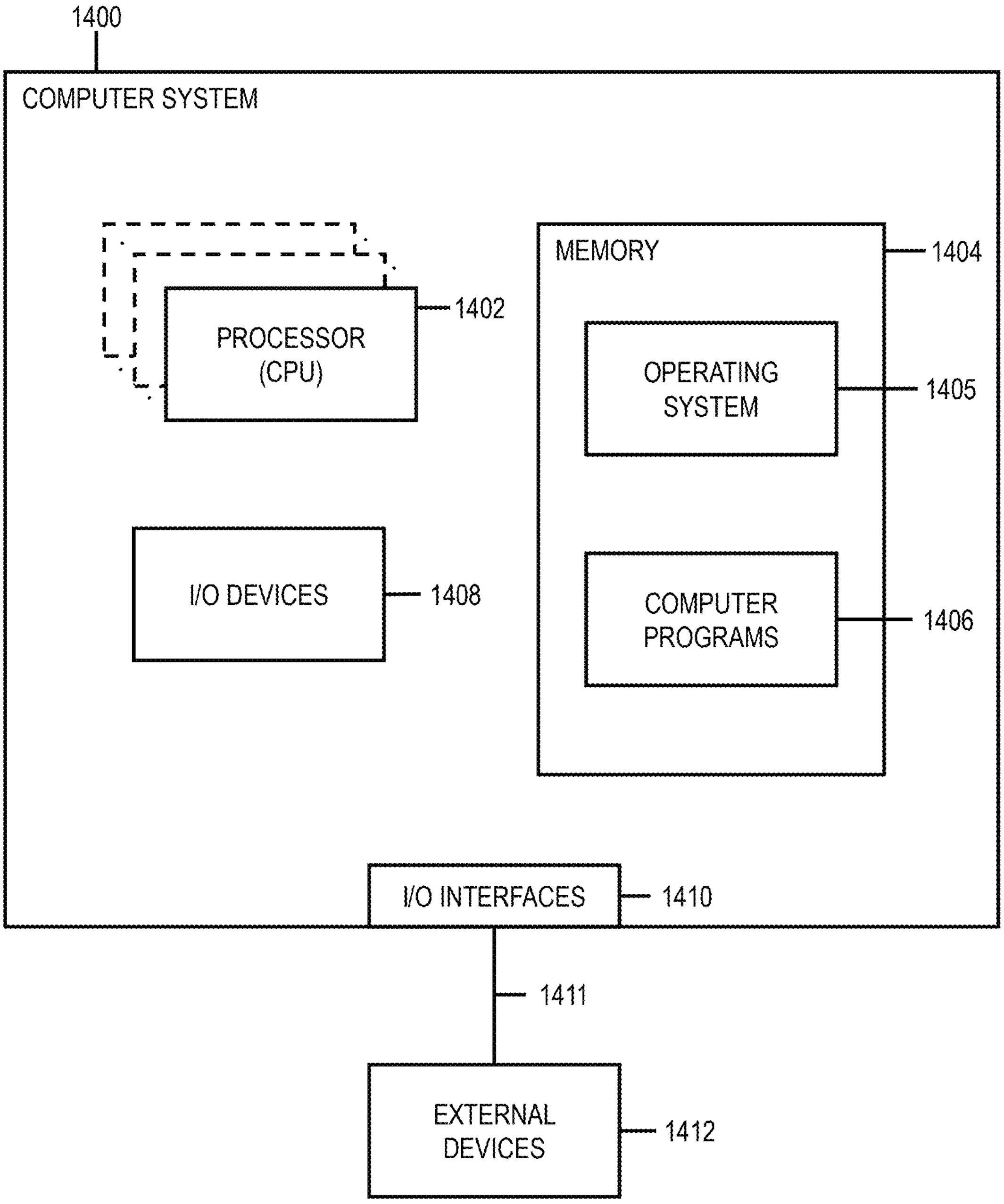
FIG. 14 depicts one example of a computer system and associated devices to incorporate and/or use aspects described herein.

FIG. 14 shows a computer system 1400 in communication with external device(s) 1412. Computer system 1400 includes one or more processor(s) 1402, for instance central processing unit(s) (CPUs). A processor can include functional components used in the execution of instructions, such as functional components to fetch program instructions from locations such as cache or main memory, decode program instructions, and execute program instructions, access memory for instruction execution, and write results of the executed instructions. A processor 1402 can also include register(s) to be used by one or more of the functional components. Computer system 1400 also includes memory 1404, input/output (I/O) devices 1408, and I/O interfaces 1410, which may be coupled to processor(s) 1402 and each other via one or more buses and/or other connections. Bus connections represent one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), the Micro Channel Architecture (MCA), the Enhanced ISA (EISA), the Video Electronics Standards Association (VESA) local bus, and the Peripheral Component Interconnect (PCI).

Memory 1404 can be or include main or system memory (e.g. Random Access Memory) used in the execution of program instructions, storage device(s) such as hard drive(s), flash media, or optical media as examples, and/or cache memory, as examples. Memory 1404 can include, for instance, a cache, such as a shared cache, which may be coupled to local caches (examples include L1 cache, L2 cache, etc.) of processor(s) 1402. Additionally, memory 1404 may be or include at least one computer program product having a set (e.g., at least one) of program modules, instructions, code or the like that is/are configured to carry out functions of embodiments described herein when executed by one or more processors.

Memory 1404 can store an operating system 1405 and other computer programs 1406, such as one or more computer programs/applications that execute to perform aspects described herein. Specifically, programs/applications can include computer readable program instructions that may be configured to carry out functions of embodiments of aspects described herein.

Examples of I/O devices 1408 include but are not limited to microphones, speakers, Global Positioning System (GPS) devices, cameras, lights, accelerometers, gyroscopes, magnetometers, sensor devices configured to sense light, proximity, heart rate, body and/or ambient temperature, blood pressure, and/or skin resistance, and activity monitors. An I/O device may be incorporated into the computer system as shown, though in some embodiments an I/O device may be regarded as an external device (1412) coupled to the computer system through one or more I/O interfaces 1410.

Computer system 1400 may communicate with one or more external devices 1412 via one or more I/O interfaces 1410. Example external devices include a keyboard, a pointing device, a display, and/or any other devices that enable a user to interact with computer system 1400. Other example external devices include any device that enables computer system 1400 to communicate with one or more other computing systems or peripheral devices such as a printer. A network interface/adapter is an example I/O interface that enables computer system 1400 to communicate with one or more networks, such as a local area network (LAN), a general wide area network (WAN), and/or a public network (e.g., the Internet), providing communication with other computing devices or systems, storage devices, or the like. Ethernet-based (such as Wi-Fi) interfaces and Bluetooth® adapters are just examples of the currently available types of network adapters used in computer systems (BLUETOOTH is a registered trademark of Bluetooth SIG, Inc., Kirkland, Washington, U.S.A.).

The communication between I/O interfaces 1410 and external devices 1412 can occur across wired and/or wireless communications link(s) 1411, such as Ethernet-based wired or wireless connections. Example wireless connections include cellular, Wi-Fi, Bluetooth®, proximity-based, near-field, or other types of wireless connections. More generally, communications link(s) 1411 may be any appropriate wireless and/or wired communication link(s) for communicating data.

Particular external device(s) 1412 may include one or more data storage devices, which may store one or more programs, one or more computer readable program instructions, and/or data, etc. Computer system 1400 may include and/or be coupled to and in communication with (e.g. as an external device of the computer system) removable/non-removable, volatile/non-volatile computer system storage media. For example, it may include and/or be coupled to a non-removable, non-volatile magnetic media (typically called a "hard drive"), a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media.

Computer system 1400 may be operational with numerous other general purpose or special purpose computing system environments or configurations. Computer system 1400 may take any of various forms, well-known examples of which include, but are not limited to, personal computer (PC) system(s), server computer system(s), such as messaging server(s), thin client(s), thick client(s), workstation(s), laptop(s), handheld device(s), mobile device(s)/computer(s) such as smartphone(s), tablet(s), and wearable device(s), multiprocessor system(s), microprocessor-based system(s), telephony device(s), network appliance(s) (such as edge appliance(s)), virtualization device(s), storage controller(s), set top box(es), programmable consumer electronic(s), network PC(s), minicomputer system(s), mainframe computer system(s), and distributed cloud computing environment(s) that include any of the above systems or devices, and the like.

Aspects of the present invention may be a system, a method, and/or a computer program product, any of which may be configured to perform or facilitate aspects described herein. In some embodiments, aspects of the present invention may take the form of a computer program product, which may be embodied as computer readable medium(s). A computer readable medium may be a tangible storage device/medium having computer readable program code/instructions stored thereon. Example computer readable medium(s) include, but are not limited to, electronic, magnetic, optical, or semiconductor storage devices or systems, or any combination of the foregoing. Example embodiments of a computer readable medium include a hard drive or other mass-storage device, an electrical connection having wires, random access memory (RAM), read-only memory (ROM), erasable-programmable read-only memory such as EPROM or flash memory, an optical fiber, a portable computer disk/diskette, such as a compact disc read-only memory (CD-ROM) or Digital Versatile Disc (DVD), an optical storage device, a magnetic storage device, or any combination of the foregoing. The computer readable medium may be readable by a processor, processing unit, or the like, to obtain data (e.g. instructions) from the medium for execution. In a particular example, a computer program product is or includes one or more computer readable media that includes/stores computer readable program code to provide and facilitate one or more aspects described herein.

As noted, program instruction contained or stored in/on a computer readable medium can be obtained and executed by any of various suitable components such as a processor of a computer system to cause the computer system to behave and function in a particular manner. Such program instructions for carrying out operations to perform, achieve, or facilitate aspects described herein may be written in, or compiled from code written in, any desired programming language. In some embodiments, such programming language includes object-oriented and/or procedural programming languages such as C, C++, C #, Java, etc.

Program code can include one or more program instructions obtained for execution by one or more processors. Computer program instructions may be provided to one or more processors of, e.g., one or more computer systems, to produce a machine, such that the program instructions, when executed by the one or more processors, perform, achieve, or facilitate aspects of the present invention, such as actions or functions described in flowcharts and/or block diagrams described herein. Thus, each block, or combinations of blocks, of the flowchart illustrations and/or block diagrams depicted and described herein can be implemented, in some embodiments, by computer program instructions.

Although various examples are provided, variations are possible without departing from a spirit of the claimed aspects.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A method for testing a sample array comprising individual samples, the method using a test tool comprising a plurality of electrically-conductive test probes, the method comprising:

positioning the plurality of test probes relative to a first plurality of contact points of the sample array, the first plurality of contact points being associated with a first plurality of individual samples of the sample array, such that the plurality of test probes come into electrical contact with the sample array at the first plurality of contact points;

driving, by way of one or more electrical signals delivered via the plurality of test probes to the first plurality of contact points, parallel electrical excitation of the first plurality of individual samples, wherein electrical contact between the plurality of test probes and the first plurality of contact points is maintained continuously while performing the driving the parallel excitation of the first plurality of individual samples, and wherein the parallel excitation of the first plurality of individual samples produces first values for testing the first plurality of individual samples;

moving the plurality of test probes relative to the sample array by moving at least one of the plurality of test probes and the sample array, such that, based on the moving, the plurality of test probes are positioned relative to a next plurality of contact points such that the plurality of test probes come into electrical contact with the next plurality of contact points, the next plurality of contact points associated with a next plurality of individual samples of the sample array; and driving, by way of one or more electrical signals delivered via the plurality of test probes to the next plurality of contact points, parallel electrical excitation of the next plurality of individual samples, wherein electrical contact between the plurality of test probes and the next plurality of contact points is maintained continuously while performing the driving the parallel excitation of the next plurality of individual samples, and wherein the parallel excitation of the first plurality of individual samples produces second values for testing the next plurality of individual samples.

2. The method of claim 1, wherein the individual samples are micro light-emitting diode (microLED) devices.

3. The method of claim 1, wherein the driving the parallel electrical excitation of the first plurality of individual samples is performed absent use of active feedback to continuously maintain the electrical contact between the plurality of test probes and the first plurality of first contact points while performing the driving the parallel electrical excitation of the first plurality of individual samples.

4. The method of claim 1, further comprising observing, based on interaction of the plurality of test probes with the first plurality of contact points, luminescence from the first plurality of individual samples.

5. The method of claim 4, further comprising confirming, based on the luminescence, that the electrical contact between the plurality of test probes and the first plurality of contact points has been made, wherein the driving is performed responsive to the confirming.

6. The method of claim 1, further comprising observing, as part of the positioning the plurality of test probes relative to the first plurality of contact points, reflective signals from the plurality of test probes.

7. The method of claim 6, further comprising confirming, based on the observed reflective signals, that the electrical contact between the plurality of test probes and the first plurality of contact points has been made, wherein the driving the parallel electrical excitation of the first plurality of individual samples is performed responsive to the confirming.

8. The method of claim 1, wherein at least a portion of each test probe of the plurality of test probes is made of translucent material.

9. The method of claim 1, wherein the plurality of test probes comprises an array of test probes with equidistant spacing between test probes of the array of test probes.

10. The method of claim 1, further comprising:

for each test probe of the plurality of test probes, submerging at least a portion of the test probe in a liquid conductive material and withdrawing the submerged at least a portion of the test probe from the liquid conductive material, wherein based on performing the submerging and the withdrawing for each of the plurality of test probes, the plurality of test probes have portions of the liquid conductive material remaining on ends of the plurality of test probe and in electrical contact with electrically-conductive portions of the plurality of test probes;

wherein the positioning the plurality of test probes positions the plurality of test probes such that the portions of the liquid conductive material remaining on the ends of the plurality of test probes makes physical contact with the first plurality of contact points, the physical contact providing the electrical contact with the sample array at the first plurality of contact points, and wherein the one or more electrical signals are delivered to the first plurality of contact points through the portions of the liquid conductive material on the ends of the plurality of test probe.

11. A computer system comprising:

a memory; and a processor in communication with the memory, wherein the computer system is configured to control a test tool comprising a plurality of electrically-conductive test probes to perform a method comprising:

positioning the plurality of test probes relative to a first plurality of contact points of the sample array, the first plurality of contact points being associated with a first plurality of individual samples of the sample array, such that the plurality of test probes come into electrical contact with the sample array at the first plurality of contact points;

driving, by way of one or more electrical signals delivered via the plurality of test probes to the first plurality of contact points, parallel electrical excitation of the first plurality of individual samples, wherein electrical contact between the plurality of test probes and the first plurality of contact points is maintained continuously while performing the driving the parallel excitation of the first plurality of individual samples, and wherein the parallel excitation of the first plurality of individual samples produces first values for testing the first plurality of individual samples;

moving the plurality of test probes relative to the sample array by moving at least one of the plurality of test probes and the sample array, such that, based on the moving, the plurality of test probes are positioned relative to a next plurality of contact points such that the plurality of test probes come into electrical contact with the next plurality of contact points, the next plurality of contact points associated with a next plurality of individual samples of the sample array; and driving, by way of one or more electrical signals delivered via the plurality of test probes to the next plurality of contact points, parallel electrical excitation of the next plurality of individual samples, wherein electrical contact between the plurality of test probes and the next plurality of contact points is maintained continuously while performing the driving the parallel excitation of the next plurality of individual samples, and wherein the parallel excitation of the first plurality of individual samples produces second values for testing the next plurality of individual samples.

12. The computer system of claim 11, wherein the individual samples are micro light-emitting diode (microLED) devices.

13. The computer system of claim 11, wherein the driving the parallel electrical excitation of the first plurality of individual samples is performed absent use of active feedback to continuously maintain the electrical contact between the plurality of test probes and the first plurality of first contact points while performing the driving the parallel electrical excitation of the first plurality of individual samples.

14. The computer system of claim 11, wherein the method further comprises observing, based on interaction of the plurality of test probes with the first plurality of contact points, luminescence from the first plurality of individual samples.

15. The computer system of claim 14, wherein the method further comprises confirming, based on the luminescence, that the electrical contact between the plurality of test probes and the first plurality of contact points has been made, wherein the driving is performed responsive to the confirming.

16. The computer system of claim 11, wherein the method further comprises observing, as part of the positioning the plurality of test probes relative to the first plurality of contact points, reflective signals from the plurality of test probes.

17. The computer system of claim 16, wherein the method further comprises confirming, based on the observed reflective signals, that the electrical contact between the plurality of test probes and the first plurality of contact points has been made, wherein the driving the parallel electrical excitation of the first plurality of individual samples is performed responsive to the confirming.

18. The computer system of claim 11, wherein at least a portion of each test probe of the plurality of test probes is made of translucent material.

19. The computer system of claim 11, wherein the plurality of test probes comprises an array of test probes with equidistant spacing between test probes of the array of test probes.

* * * * *